United States Patent [19]
Nguyen et al.

[11] Patent Number: 6,163,168
[45] Date of Patent: *Dec. 19, 2000

[54] EFFICIENT INTERCONNECT NETWORK FOR USE IN FPGA DEVICE HAVING VARIABLE GRAIN ARCHITECTURE

[75] Inventors: Bai Nguyen, San Jose; Om P. Agrawal, Los Altos; Bradley A. Sharpe-Geisler, San Jose; Jack T. Wong, Fremont; Herman M. Chang, Cupertino, all of Calif.

[73] Assignee: Vantis Corporation, Sunnyvale, Calif.

[ * ] Notice: This patent is subject to a terminal disclaimer.

[21] Appl. No.: 09/208,203

[22] Filed: Dec. 9, 1998

[51] Int. Cl.[7] .......................... H01L 25/00; H03K 19/177
[52] U.S. Cl. ................... 326/41; 326/39; 326/47
[58] Field of Search .................. 326/41, 40, 39, 326/47, 38

[56] References Cited

U.S. PATENT DOCUMENTS

| | | | |
|---|---|---|---|
| 5,233,539 | 8/1993 | Agrawal et al. | 364/489 |
| 5,455,525 | 10/1995 | Ho et al. | 326/41 |
| 5,537,057 | 7/1996 | Leong et al. | 326/41 |
| 5,543,732 | 8/1996 | McClintock et al. | 326/41 |
| 5,581,199 | 12/1996 | Pierce et al. | 326/41 |
| 5,598,109 | 1/1997 | Leong et al. | 326/41 |
| 5,689,195 | 11/1997 | Cliff et al. | 326/41 |
| 5,900,743 | 5/1999 | McClintock et al. | 326/41 |

FOREIGN PATENT DOCUMENTS 2 318 663   4/1998   United Kingdom ......... H03K 19/177

*Primary Examiner*—Michael Tokar
*Assistant Examiner*—Daniel D. Chang
*Attorney, Agent, or Firm*—Fliesler, Dubb, Meyer & Lovejoy LLP

[57] ABSTRACT

A logic array device has an array of plural interconnect resources including plural lines and plural switchbox areas, with an array of plural Variable Grain Blocks (VGB's) interspersed within the array of plural interconnect resources. The array of plural interconnect resources does not regularly include lines of single-length or shorter, and the array of plural interconnect resources does not regularly include switchbox areas that are spaced apart from one another by distances of a single-length or shorter. The single-length corresponds to a traverse of a continuous distance covering approximately one VGB.

31 Claims, 15 Drawing Sheets

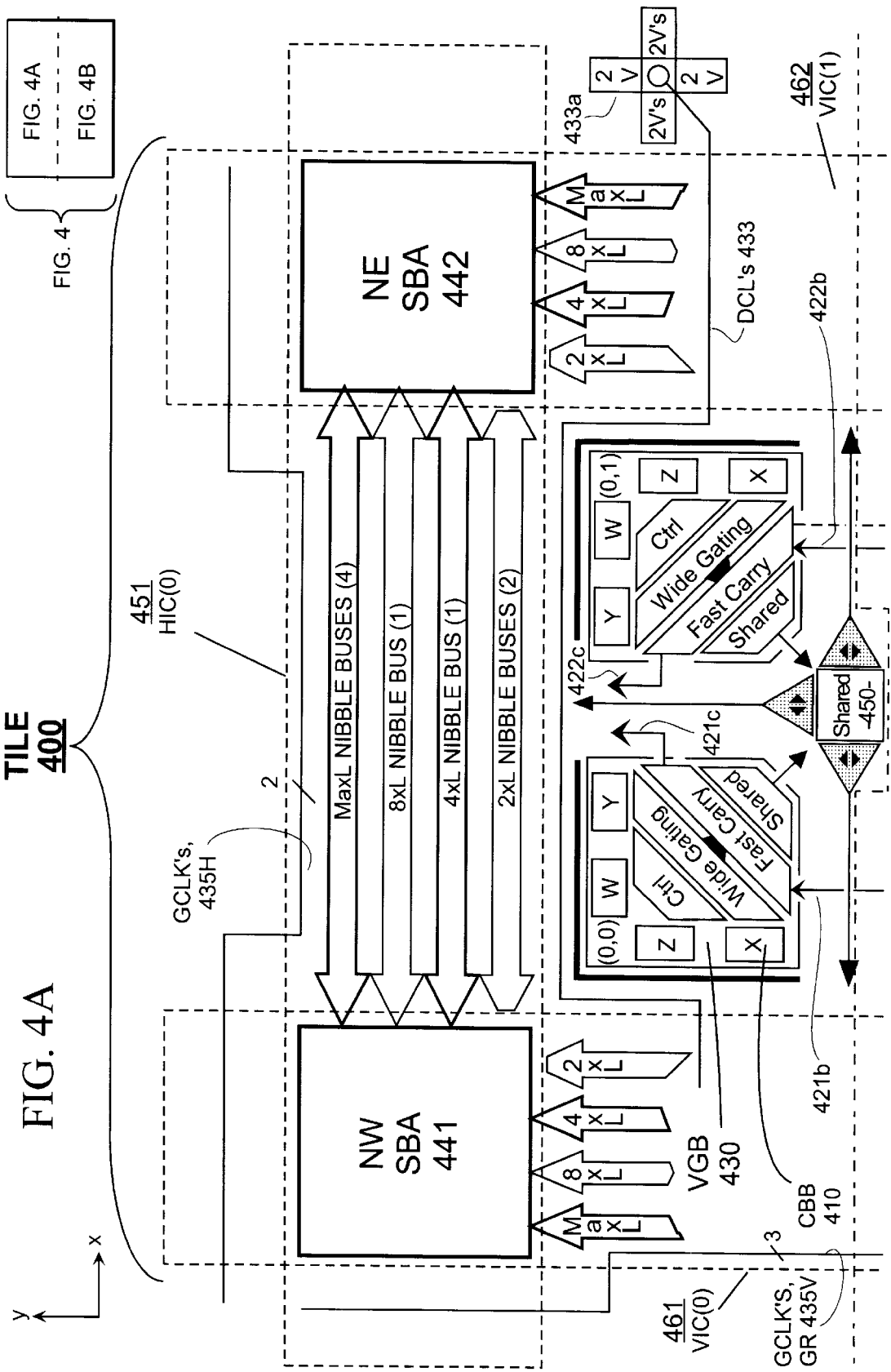

EFFICIENT INTERCONNECT NETWORK FOR USE IN FPGA DEVICE HAVING VARIABLE GRAIN ARCHITECTURE

BACKGROUND

1. Field of the Invention

The invention relates generally to integrated circuits having repeated logic and interconnect structures provided therein. The invention relates more specifically to the problem of selecting the numbers and types of interconnect resources to be provided within an integrated circuit monolith that contains a field programmable gate array (FPGA).

2a. Cross Reference to Related Applications

The following co-pending U.S. patent applications(s) are related to the present application and their disclosures are incorporated herein by reference:

(A) Ser. No. 08/948,306 filed Oct. 9, 1997 by Om P. Agrawal et al. and originally entitled, "VARIABLE GRAIN ARCHITECTURE FOR FPGA INTEGRATED CIRCUITS";

(B) Ser. No. 08/996,361 filed Dec. 22, 1997, by Om Agrawal et al. and originally entitled, "SYMMETRICAL, EXTENDED AND FAST DIRECT CONNECTIONS BETWEEN VARIABLE GRAIN BLOCKS IN FPGA INTEGRATED CIRCUITS";

(C) Ser. No. 08/995,615 filed Dec. 22, 1997, by Om Agrawal et al. and originally entitled, "A PROGRAMMABLE INPUT/OUTPUT BLOCK (IOB) IN FPGA INTEGRATED CIRCUITS";

(D) Ser. No. 08/995,614 filed Dec. 22, 1997, by Om Agrawal et al. and originally entitled, "INPUT/OUTPUT BLOCK (IOB) CONNECTIONS TO MAXL LINES, NOR LINES AND DENDRITES IN FPGA INTEGRATED CIRCUITS";

(E) Ser. No. 08/995,612 filed Dec. 22, 1997, by Om Agrawal et al. and originally entitled, "FLEXIBLE DIRECT CONNECTIONS BETWEEN INPUT/OUTPUT BLOCKS (IOBs) AND VARIABLE GRAIN BLOCKS (VGBs) IN FPGA INTEGRATED CIRCUITS";

(F) Ser. No. 08/997,221 filed Dec. 22, 1997, by Om Agrawal et al. and originally entitled, "PROGRAMMABLE CONTROL MULTIPLEXING FOR INPUT/OUTPUT BLOCKS (IOBs) IN FPGA INTEGRATED CIRCUITS";

(G) Ser. No. 08/996,049 filed Dec. 22, 1997 by Om P. Agrawal et al. and originally entitled, "DUAL PORT SRAM MEMORY FOR RUN-TIME USE IN FPGA INTEGRATED CIRCUITS;

(H) Ser. No. 09/008,762 filed Jan. 19, 1998 by Om P. Agrawal et al. and originally entitled, "SYNTHESIS-FRIENDLY FPGA ARCHITECTURE WITH VARIABLE TIMING INTERCONNECT";

(H) Ser. No. 09/187,689 filed Nov. 5, 1998 by Om P. Agrawal et al. and originally entitled, "TILEABLE AND COMPACT LAYOUT FOR SUPER VARIABLE GRAIN BLOCKS WITHIN FPGA DEVICE".

2b. Cross Reference to Related Patents

The following U.S. patent(s) are related to the present application and their disclosures are incorporated herein by reference:

(A) U.S. Pat. No. 5,212,652 issued May 18, 1993 to Om Agrawal et al, (filed as Ser. No. 07/394,221 on Aug. 15, 1989) and entitled, PROGRAMMABLE GATE ARRAY WITH IMPROVED INTERCONNECT STRUCTURE;

(B) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES; and (C) U.S. Pat. No. 5,185,706 issued Feb. 9, 1993 to Om Agrawal et al.

3. Description of Related Art

As the density of digital logic circuitry within integrated circuits (IC's) increases, and as the signal-processing speed of such logic also increases, the ability of interconnect to route all signals in timely fashion between spaced-apart logic sections (e.g., CLB's) becomes more problematic and more important to proper operation of the integrated circuit.

Physical layout of logic sections within each logic area of an IC device may play a critical role in defining the signal-processing speed of the overall IC device. Device performance may also be affected by the physical separation between critical logic sections. Device performance may be further affected by the interplay between interconnect resource allocation and logic resource allocation.

More specifically, when it comes to the field of programmable logic arrays, artisans have begun to recognize that conductors of different lengths, orientations, and other attributes should be provided for servicing different kinds of signals. By way of example, a first class of relatively long, low resistance conductors may be provided for broadcasting common control signals (e.g., clock, clock enable, etc.) over relatively large distances of the IC device with minimal skew. Such special conductors are sometimes referred to as low-skew longlines.

Artisans have also begun to realize that significantly shorter wire segments may be advantageously dedicated for transmitting logic input and logic output signals between immediately adjacent logic sections. These dedicated conductors are sometimes referred to as direct-connect lines.

At the same time, artisans wish to provide field programmable logic array devices with general-purpose conductors and general-purpose routing switches (or routing switch boxes) for carrying out general-purpose, programmable routing of signals. It is desirable to have FPGA's that can be configured to efficiently accommodate a wide variety of to-be-implemented designs. The variety of designs can span a taxonomic universe that includes 'random logic' at one end, highly-ordered data-path structures at the other end, and intermediately-ordered control logic structures in between.

The evolution in the art of FPGA's toward using both general purpose and special purpose conductors within the interconnect portion of logic arrays should mesh with a concurrent and general evolution affecting logic circuits per se. The logic circuitry of logic array IC's is consistently evolving towards faster signal processing speeds and greater per area densities of logic functionalities. On one hand, artisans wish to provide field programmable logic arrays with as much logic functionality as is usefully possible. On the other hand, artisans wish to provide in such FPLA's as much flexible interconnect capability as is usefully possible.

At some point, the amount of logic functionality that is provided begins to compete for limited space within the IC device with the amount of interconnect functionality that is also provided in the same device.

This conflict creates a need for properly selecting the numbers and types of interconnect resources that are provided or not provided within the IC device. Types and numbers of interconnect resources of each type should be tailored so as to efficiently mesh with the densities of the logic functionalities that are provided in the same IC device. The types and numbers of interconnect resources of each type should also be tailored so as to efficiently accommodate variations in design specification with respect to the timing and processing of broadcast control signals, of high-speed local signals, and also of randomly-routed, general purpose signals.

SUMMARY OF INVENTION

In accordance with the invention, a 'variable-grain' type of FPGA device is provided with an improved interconnect network that has in its repeated-pattern, essentially no or a relatively small fraction of single-CLB-length wires (single-CBB-length wires) that couple into a respective repeated pattern of switchbox areas.

Small-grained logic sections (e.g., VGB's, CBB's) of the FPGA are preferably wedged together to reduce the amount of wire length that may be consumed by having interconnect wires cross over one or more, intervening, interconnect channels. Short-haul, feedback lines that do not cross over any interconnect channels are preferably provided and used for defining local coupling between wedged together, small-grained logic sections (e.g., VGB's, CBB's).

Longer-haul, direct-connect lines are preferably provided and used for defining local coupling between small-grained logic sections (e.g., CBB's, VGB's) that are separated by one or a small number of interconnect channels.

Substantially-longer, broadcast lines (e.g., MaxL lines) are preferably provided and used for defining long-distance coupling between logic sections (e.g., VGB's) that are separated by relatively large numbers of interconnect channels.

Intermediate-length, general routing lines (2×L, 4×L, 8×L, etc.) are preferably provided and used for defining intermediate-distance and general coupling between logic sections (e.g., VGB's) that are separated by relatively intermediate numbers of interconnect channels.

In one embodiment, each interconnect channel has different types of lines provided in whole multiples of four so as to support nibble-wide processing. In one particular species of that embodiment, each interconnect channel has at least 8 feedback lines (FBL's), at least 16 direct connect lines (DCL's), at least 8 double-length lines (2×L's), no single-length lines, at least 4, quad-length lines (4×L's), at least 4 octal-length lines (8×L's), and at least 16 maximum-length lines (MaxL's); where double-length refers to a continuous linear distance extending adjacent to two consecutive VGB structures. The elimination of single-length lines is concomitant with an elimination of switchbox areas at spaced-apart, single-length distances. This elimination of switchbox areas allows VGB's to be wedged closer together and beneficially reduces lengths of conductors that directly couple such wedged-together VGB's. This elimination of switchbox areas also reduces the amount of delay imposed on signals that are loaded by switchbox routing elements (e.g., PIP's).

Other aspects of the invention will become apparent from the below detailed description.

BRIEF DESCRIPTION OF THE DRAWINGS

The below detailed description makes reference to the accompanying drawings, in which.

DETAILED DESCRIPTION

Figure 1A:
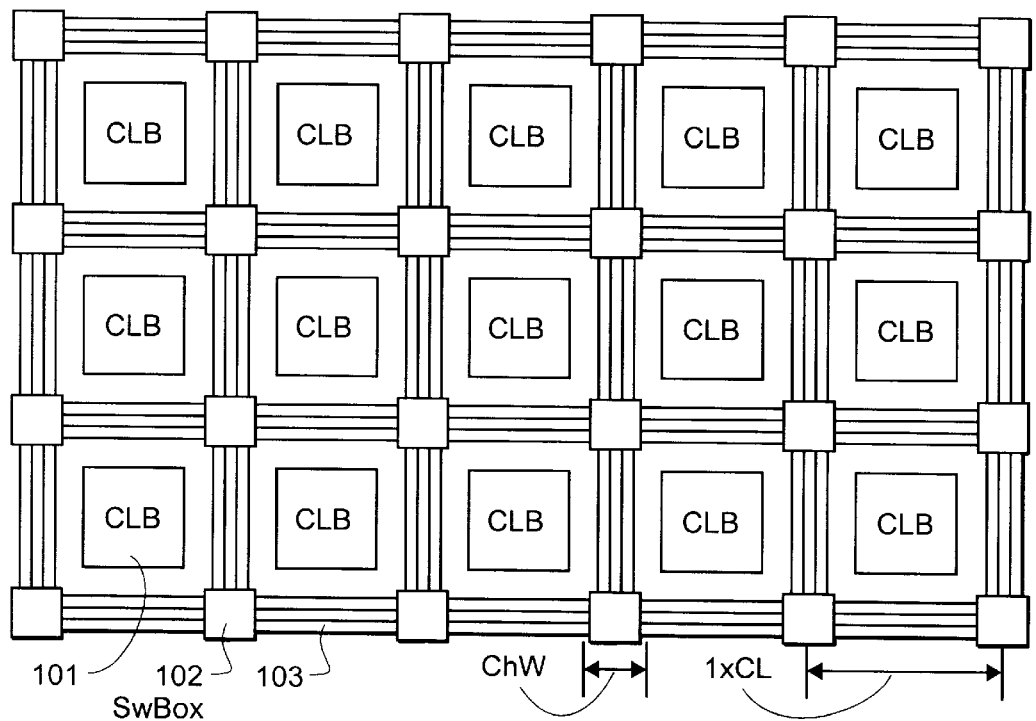
FIG. 1A illustrates in a general way, a previous approach to integrating an array of Configurable Logic Blocks (CLB's) with a general-purpose interconnect network.

FIG. 1A shows a first integrated circuit device 100 having a conventional layout. A regular pattern of Configurable Logic Blocks (CLB's) is distributed as shown in spaces between intersecting vertical and horizontal interconnect channels. One such CLB is denoted at 101. One of a repeated plurality of channel-interconnecting switchboxes is denoted at 102 (SwBox). A plurality of horizontal lines that each extends continuously between but not beyond switch box 102 and the next switch box is denoted as 103.

Each of the vertical and horizontal interconnect channels is defined by a respective, linear sequence of switch boxes such as 102 and interconnect lines such as 103. Each channel has a respective channel width as denoted by ChW in FIG. 1A. Each set of interconnect lines such as 103 has a respective line length as denoted by 1×CL in FIG. 1A. For the arrangement 100 of FIG. 1A, the notation, 1×CL indicates that the corresponding line length is about one times a side dimension of the corresponding CLB (one CLB length).

When signals travel from one CLB to another CLB in device 100, the signals must travel across at least one channel width (ChW) because CLB's are at minimum separated by that distance. When signals travel about the general interconnect network, through respective interconnect lines and switch boxes, the signals are loaded by a minimum of 3 switchboxes and 2 line lengths. Consider for example a signal traveling through switchbox 102 on its way to a line in horizontal bus 103. That signal came from another bus, say the horizontal one under CLB 101. The signal is therefore loaded by the beginning and end switchboxes of the other line (in the bus under 101), the capacitance of the other line, the capacitance of the line in bus 103, and by the end switchbox of the 103 line. Hence there is a minium loading of 3 switchboxes and 2 line lengths. If the signal travels a longer path through the general interconnect, the loading and signal delay increases accordingly. Thus, for larger and larger arrays of CLB's, delay due to increasing numbers of switchboxes on each signal-routing path becomes a growing problem.

Figure 1B:
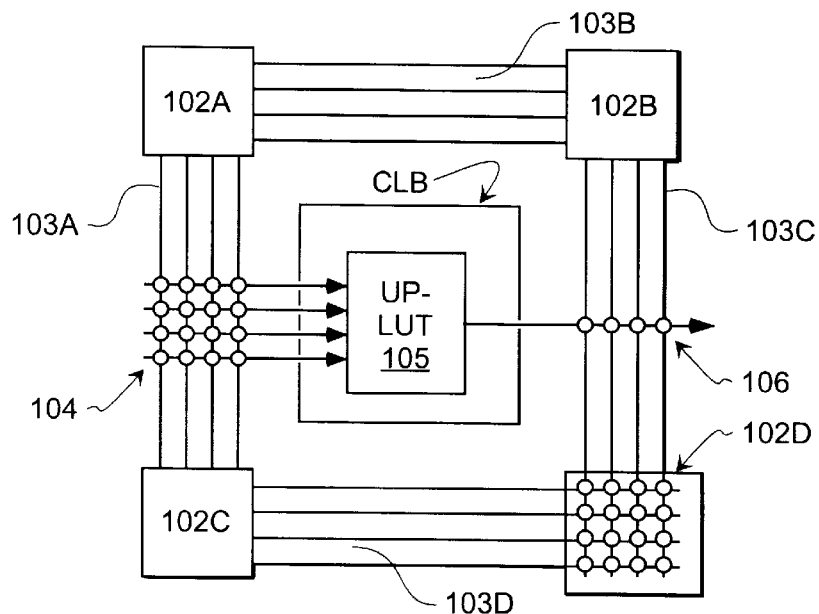
FIG. 1B shows in a general way, a previous approach for providing coupling between adjacent interconnect lines of the general-purpose interconnect network and a programmable lookup table (UP-LUT) within an exemplary CLB.

FIG. 1B shows some further details of the conventional design. Each CLB (e.g., 101) is characterized as having at least one, user-programmable, lookup table (UP-LUT) 105 that can receive input term signals from adjacent interconnect lines and can output an LUT result signal onto one of its AIL's (adjacent interconnect lines). The result signal can be any user-defined, Boolean function of the LUT input term signals. In the example of FIG. 1B, a full crossbar 104 comprised of a 4×4 array of programmable interconnect points (PIP's) allows UP-LUT 105 to obtain each of its input term signals from any one of the lines in the left vertical bus 103A. A full-width output multiplexer 106 allows UP-LUT 105 to route its result signal to any one of the lines in the right vertical bus 103C.

Each of switchboxes 102A–102D in FIG. 1B contains a full crossbar of PIP's such as represented within 102D. This switchbox internal crossbar is for allowing a signal on any first line of the switchbox to continue traveling along any other line of the switchbox. The illustrated 4×4 array of PIP's in 102D is merely representative. A much bigger array is needed to provide true crossbar interconnect between the 16 lines that enter switchbox 102D (only 8 such lines are shown). Those skilled in the art will appreciate that partially-populated schemes may be used for the purpose of reducing capacitive loading by the switchboxes, the trade-off being a reduced flexibility in routing choices.

As explained above, signal-propagating delays due to passage through switchboxes can present a problem. One may reduce the delays encountered by signals traveling between different CLB's, by using alternate connection schemes. One example is the use of so-called, direct-connect wires between immediately adjacent CLB's (not shown in FIGS. 1A–1B). Another example is the use of so-called, longline wires that each extend continuously in the vertical or horizontal direction across the full span of the array.

However, these alternate schemes do not provide cure-all solutions. If one tries to provide a separate direct-connect wire between each CLB that may act as a signal-source and every other CLB that may potentially need to receive the signal, the number of wires would explode to astronomic values as array size scales upwardly. If one tries to use only longlines for interconnect, routability would be severely limited and excessive delay would be imposed on signals that need to travel only a short distance. It is therefore still beneficial to have a general interconnect that provides generically flexible routing.

The question then becomes, what types of wires and numbers of each type should be included in the general interconnect mesh? What other types of wires and numbers of each type should be included in the specialized interconnect mesh?

The answer, in accordance with the invention, is that there should be essentially no single-length, linear wires included in the general interconnect mesh. There should be no switchboxes that are regularly spaced apart by a distance corresponding to the single-length, linear wires. Instead, the smallest linear wires of the general interconnect mesh should each be at least of a continues double-length (2×L) if not longer. The smallest linear separation between consecutive switchbox areas should each be at least that of a continues double-length (2×L) if not longer.

When used herein to refer to a given line or separation, the term 'double-length' (2×L) indicates that the given line or separation extends continuously over a distance corresponding to two adjacent VGB's (variable grain blocks).

A VGB, as its name implies, has the characteristic of programmably-variable granularity. This means that the apparent number of UP-LUT's in the VGB can be varied by user-supplied configuration instructions and the number of inputs for each such UP-LUT can also be varied by user-supplied configuration instructions. See the above-referenced, U.S. application Ser. No. 08/948,306 for details on how this may accomplished. If a coarse level of granularity is programmably-established in a VGB, that VGB may be viewed as being akin to a CLB having a wide-input UP-LUT contained therein (e.g., a 6-input LUT).

Figure 2A:
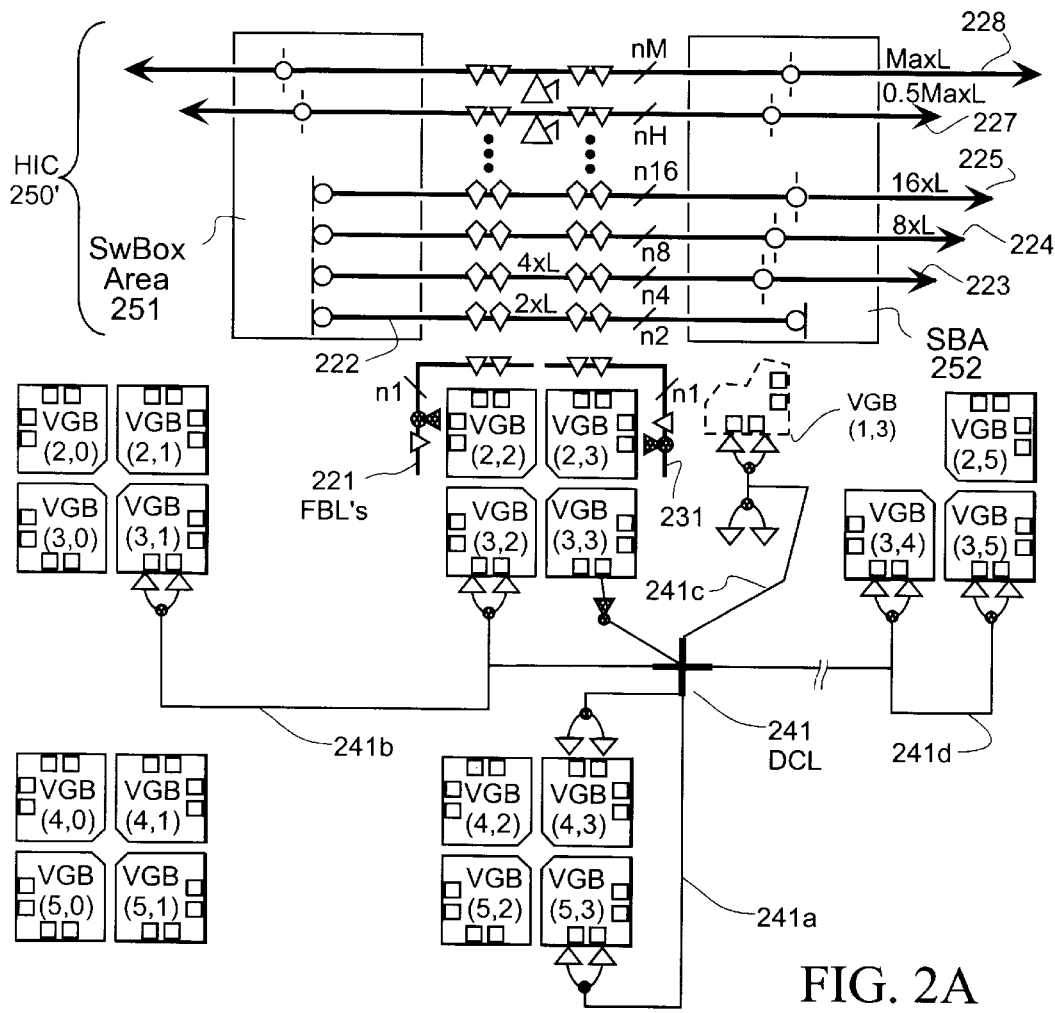
FIG. 2A illustrates a compilation of linear and nonlinear lines for carrying signals within a Variable Grain Architecture device in accordance with the invention.

As seen in FIG. 2A, in accordance with the invention, consecutive ones of arrayed switchbox areas such as 251 and 252 are spaced apart from one another by a distance of at least two consecutive ones of arrayed VGB's (a 2×L separation). There are no single-length, linear wires included in the general interconnect mesh of this embodiment. Instead, the smallest linear wires of the general interconnect mesh are exemplified by double-length bus 222 which contains a plurality of a whole number, n2 of linearly-extending interconnect wires each of a continuous double-length (2×L). One end of each wire in 2×L bus 222 terminates in switchbox area 251 while a second end terminates in switchbox area 252. Each end termination couples into a corresponding PIP (programmable interconnect point) that can provide coupling to yet another interconnect wire of the same switchbox area. The PIP's at opposed ends of a given 2×L line may be all deactivated so that signals on that 2×L line do not propagate through the switchbox areas 251, 252 to continue along further interconnect lines. Even when such deactivation occurs, a 2×L line may be used to propagate signals from a first, immediately adjacent VGB to a second immediately adjacent VGB.

Figure 2B:
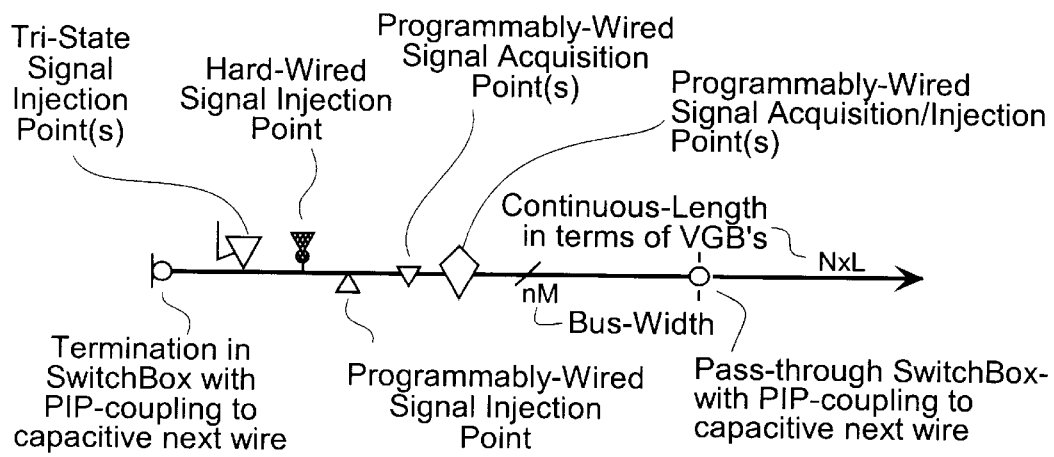
FIG. 2B provides a legend for various symbols used in FIG. 2A.
Figures 1, 2C:
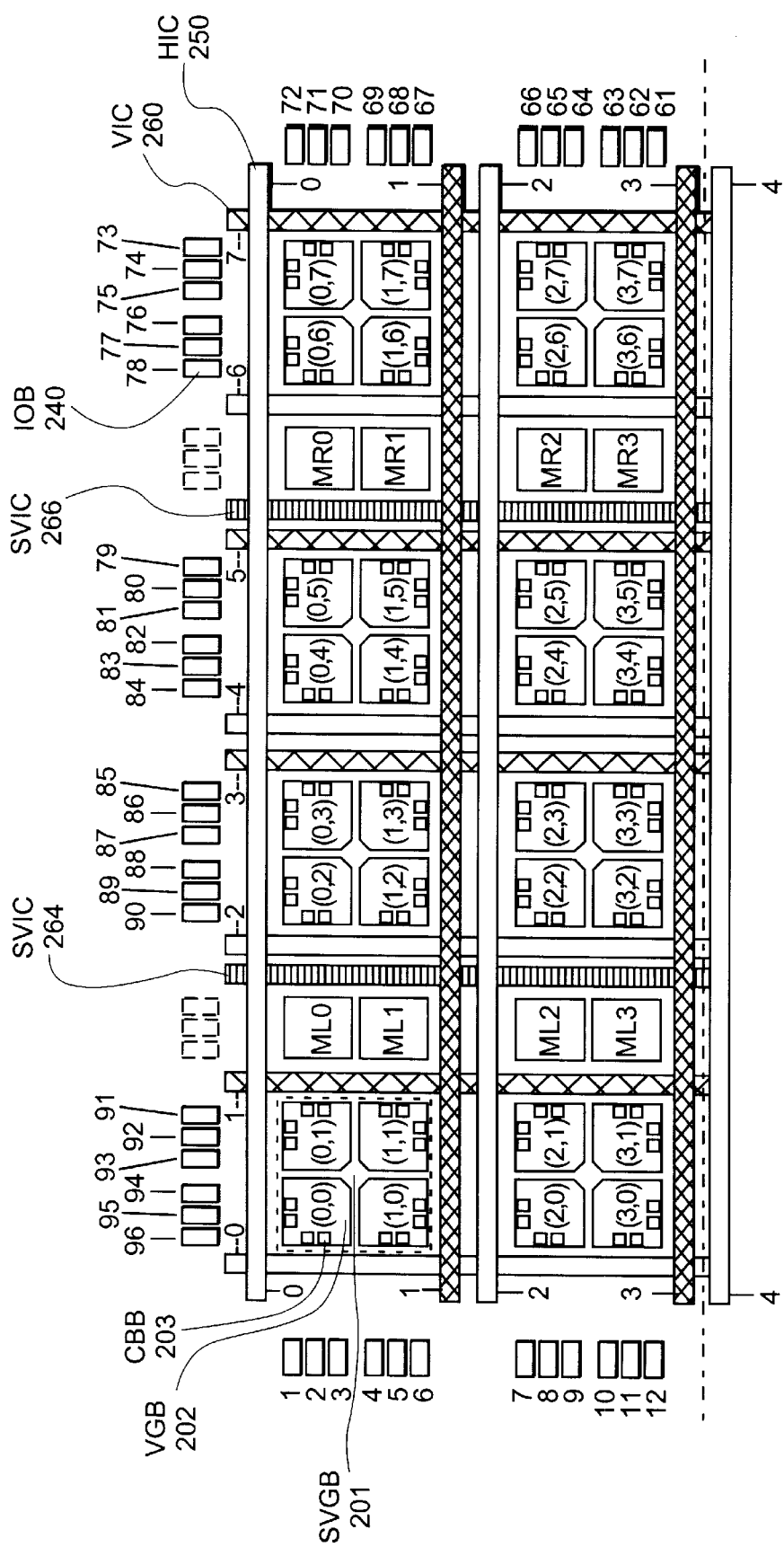
FIG. 2C illustrates the layout of an IC logic-array device in accordance with the invention.

In the illustrated example, the wires of 2×L bus 222 are immediately adjacent to two variable grain blocks designated as VGB(2,2) and VGB(2,3). Variable grain blocks VGB(2,2) and VGB(2,3) are part of a larger regular array of N×M such blocks as will be seen shortly when FIG. 2C is described. It is worthwhile to note here that the lack of single-length, linear wires in the general interconnect mesh allows groups of variable grain blocks such as VGB(2,2), VGB(2,3), VGB(3,2) and VGB(3,3) to be brought closer together (to be wedged together) so as to define compact super-structures that are referred to herein as Super Variable Grain Blocks or SVGB's. The omission of intervening interconnect channels through the interior of SVGB's allows for shorter wire lengths within SVGB's, and hence less capacitance, less resistance and shorter signal transmission times.

FIG. 2C shows a macroscopic view of an FPGA device 200 in accordance with the invention. The illustrated structure is preferably formed as a monolithic integrated circuit.

The macroscopic view of FIG. 2C is to be understood as being taken at a magnification level that is lower than later-provided, microscopic views. The more microscopic views may reveal greater levels of detail which may not be seen in more macroscopic views. And in counter to that, the more macroscopic views may reveal gross architectural features which may not be seen in more microscopic views. It is to be understood that for each more macroscopic view, there can be many alternate microscopic views and that the illustration herein of a sample microscopic view does not limit the possible embodiments of the macroscopically viewed entity.

FPGA device 200 includes a regular matrix of super structures which are also referred to herein as super-VGB's (SVGB's). In the illustrated embodiment, a dashed box (upper left corner) circumscribes one such super-VGB structure which is referenced as 201. There are four super-VGB's shown in each super row of FIG. 2C and also four super-VGB's shown in each super column. Each super row or column contains plural rows or columns of VGB's. One super column is identified as an example by the braces at 211. Larger matrices with more super-VGB's per super column and/or super row are of course contemplated. FIG. 2C is merely an example.

There is a hierarchy of user-configurable resources within each super-VGB. At a next lower level, each super-VGB is seen to contain four VGB's. In the illustrated embodiment, identifier 202 points to one such VGB within SVGB 201.

A VGB is a Variable Grain Block that includes its own hierarchy of user configurable resources. At a next lower level, each VGB is seen to contain four Configurable Building Blocks or CBB's arranged in a L-shaped configuration. In the illustrated embodiment, identifier 203 points to one such CBB within VGB 202.

At a next lower level, each CBB has its own hierarchy of user configurable resources. Some of these may be shown in later figures. A more detailed description of the hierarchal resources of the super-VGB's, VGB's, CBB's, and so forth, may be found in the above-cited Ser. No. 08/948,306 filed Oct. 9, 1997 by Om P. Agrawal et al. and originally entitled, "VARIABLE GRAIN ARCHITECTURE FOR FPGA INTEGRATED CIRCUITS", whose disclosure is incorporated herein by reference.

It is sufficient for the present to appreciate that each CBB is capable of producing and storing at least one bit of result data and/or of outputting the result data to adjacent interconnect lines. Each VGB (202) is in turns therefore capable of producing and outputting at least 4 such result bits at a time to adjacent interconnect lines. This is referred to as nibble-wide processing. Nibble-wide processing may also be carried out by the four CBB's that line the side of each SVGB (e.g., 201).

With respect to the adjacent interconnect lines (AIL's), each SVGB is immediately bounded by two horizontal and two vertical interconnect channels (HIC's and VIC's). An example of a HIC is shown at 250. A sample VIC is shown at 260. Each such interconnect channel contains a diverse set of interconnect lines and switchbox areas (SBA's) at their intersections as will be explained.

The combination of each SVGB (e.g., 201) and its surrounding interconnect resources (of which resources, the SBA's and others are not all are shown in FIG. 2C) is referred to as a matrix tile. Matrix tiles are tiled one to the next as seen, with an exception occurring about the vertical sides of the two central, super columns, 215. Columns 214 (LMC) and 216 (RMC) of embedded memory are provided along the vertical sides of the central pair 215 of super columns. These columns 214, 216 are described in more detail in the above-cited Ser. No. 08/996,049 filed Dec. 22, 1997, by Om Agrawal et al. and originally entitled, "DUAL PORT SRAM MEMORY FOR RUN-TIME USE IN FPGA INTEGRATED CIRCUITS".

From a more generalized perspective, the tiling of the plural tiles creates pairs of adjacent interconnect channels within the core of the device 200. An example of a pair of adjacent interconnect channels is seen at HIC's 1 and 2. The peripheral channels (HIC0, HIC7, VIC0, VIC7) are not so paired. Switchbox areas (not shown in FIG. 2C, see 251, 252 of FIG. 2A) are formed at the intersections of the respective vertical and horizontal interconnect channels. The four switchbox areas (designated as NW, NE, SE and SW) form part of each matrix tile construct that includes a super-VGB at its center.

The left memory column (LMC) 214 is embedded as shown to the left of central columns pair 215. The right memory column (RMC) 216 is further embedded as shown to the right of the central columns pair 215. It is contemplated to have alternate embodiments with greater numbers of such embedded memory columns symmetrically distributed in the FPGA device.

Within the illustrated LMC 214, a first, special, vertical interconnect channel (SVIC) 264 is provided adjacent to respective, left memory BLOCKS ML0 through ML7. Within the illustrated RMC 264, a second, special, vertical interconnect channel (SVIC) 266 is provided adjacent to respective, right memory BLOCKS MR0 through MR7.

As seen, the memory blocks, ML0–ML7 and MR0–MR7 are numbered in accordance with the VGB row they sit in (or the HIC they are closest to) and are further designated as left or right (L or R) depending on whether they are respectively situated in LMC 214 or RMC 216. In one embodiment, each of memory blocks, ML0–ML7 and MR0–MR7 is organized to store and retrieve an addressable plurality of nibbles, where a nibble contains 4 data bits. More specifically, in one embodiment, each of memory blocks, ML0–ML7 and MR0–MR7 is organized as a group of 32 nibbles (32×4=128 bits) where each nibble is individually addressable by five address bits. The nibble-wise organization of the memory blocks, ML0–ML7 and MR0–MR7 corresponds to the nibble-wise organization of each VGB (202) and/or to the nibble-wise organization of each group of four CBB's that line the side of each SVGB (201). Thus, there is a data-width match between each embedded memory block and each group of four CBB's or VGB and adjoining interconnect buses of different lengths.

At the periphery of the FPGA device 200, there are three input/output blocks (IOB's) for each row of VGB's and for each column of VGB's. One such IOB is denoted at 240. The IOB's in the illustrated embodiment are shown numbered from 1 to 96. In one embodiment, there are no IOB's directly above and below the LMC 214 and the RMC 216. In an alternate embodiment, special IOB's such as shown in phantom at 213 are provided at the end of each memory column for driving address and control signals into the corresponding memory column.

Each trio of regular IOB's at the left side (1–24) and the right side (49–72) of the illustrated device 200 may be user-configured to couple to the nearest HIC. Similarly, each trio of regular IOB's on the bottom side (25–48) and top side (73–96) may be user-configured for exchanging input and/or output signals with lines inside the nearest corresponding VIC. The SIOB's (e.g., 213), if present, may be user-configured to exchange signals with the nearest SVIC (e.g., 264). Irrespective of whether the SIOB's (e.g., 213) are present, data may be input and/or output from points external of the device 200 to/from the embedded memory columns 214, 216 by way of the left side IOB's (1–24) and the right side IOB's (49–72) using longline coupling. The longline coupling allows signals to move with essentially same speed and connectivity options from/to either of the left or right side IOB's (1–24, 49–72) respectively to/from either of the left or right side memory columns.

Data and/or address and/or control signals may also be generated within the FPGA device 200 by its internal VGB's and transmitted to the embedded memory 214, 216 by way of the HIC's.

The VGB's are numbered according to their column and row positions. Accordingly, VGB(0,0) is in the top left corner of the device 200; VGB(7,7) is in the bottom right corner of the device 200; and VGB(1,1) is in the bottom right corner of SVGB 201.

Each SVGB (201) may have centrally-shared resources. Such centrally-shared resources are represented in FIG. 2C by the diamond-shaped hollow at the center of each illustrated super-VGB (e.g., 201). Longline driving amplifiers correspond with these diamond-shaped hollows and have their respective outputs coupling vertically and horizontally to the adjacent HIC's and VIC's of their respective super-VGB's.

As indicated above, each super-VGB in FIG. 2C has four CBB's along each of its four sides. The four CBB's of each such interconnect-adjacent side of each super-VGB can store a corresponding four bits of result data internally so as to define a nibble of data for output onto the adjacent interconnect lines. At the same time, each VGB contains four CBB's of the L-shaped configuration which can acquire and process a nibble's worth of data. One of these processes is nibble-wide addition within each VGB as will be described below. Another of these processes is implementation of a 4:1 dynamic multiplexer within each CBB. The presentation of CBB's in groups of same number (e.g., 4 per side of a super-VGB and 4 within each VGB) provides for a balanced handling of multi-bit data packets along rows and columns of the FPGA matrix. For example, nibbles may be processed in parallel by one column of CBB's and the results may be efficiently transferred in parallel to an adjacent column of CBB's for further processing. Such nibble-wide handling of data also applies to the embedded memory columns 214/216. Nibble-wide data may be transferred between one or more groups of four CBB's each to a corresponding one or more blocks of embedded memory (MLx or MRx) by way of sets of 4 equally-long lines in a nearby HIC. Each such set of 4 equally-long lines may be constituted by the double-length lines (2×L lines), quad-length lines (4×L lines), octal-length lines (8×L lines) or maximum length longlines (MaxL lines).

In one particular embodiment of the FPGA device, the basic matrix is 10-by-10 SVGB's, with embedded memory columns 214/216 positioned around the central two super columns 115. In that particular embodiment, the integrated circuit is formed on a semiconductor die having an area of about 120,000 mils$^2$ or less. The integrated circuit includes at least four metal layers for forming interconnect. So-called 'direct connect' lines and 'longlines' of the interconnect are preferably implemented entirely by the metal layers so as to provide for low resistance pathways and thus relatively small RC time constants on such interconnect lines. Logic-implementing transistors of the integrated circuit have drawn channel lengths of 0.35 microns or 0.25 microns or less. Amplifier output transistors and transistors used for interfacing the device to external signals may be larger, however.

As indicated above, the general interconnect channels (e.g., HIC 250, VIC 260 of FIG. 2C) contain a diverse set of interconnect lines. FIG. 2A shows a distribution of different-length horizontal interconnect lines (2×L, 4×L, 8×L, 16×L, . . . , 0.5MaxL, MaxL) and associated switchbox areas of a single horizontal interconnect channel (HIC) 250'

Double-length bus 222 has ends that terminate in switchbox areas 251, 252 as explained above. Even though there are no single-length wires, a source CBB in VGB(2,2) may use an adjacent interconnect line such as in double-length bus 222 to transfer a result signal to a nearby destination CBB such as one in VGB(2,3) without having to pass the signal through a switchbox area. The transmission path for this kind of transfer (which path is not fully shown) flows through the programmably-actuated, bidirectional, signal acquisition-and-injection points such as represented by hollow diamonds. See also the legend of FIG. 2B.

In addition to the CBB-to-CBB path that is provided by the adjacent interconnect lines of 2×L buses such as 222, any first CBB of a given VGB may communicate with any other second CBB of the same VGB by using so-called feedback lines. These feedback lines are found for example in L-shaped bus 221. There is a plurality of n1 wires in bus 221 where each feedback line (FBL) extends continuously about the channel-facing periphery of the corresponding VGB. In one embodiment, each CBB has two FBL's dedicated to it. The CBB to which the FBL is dedicated, can output signals onto that FBL by way of a hardwired, output connection. Each of the remaining CBB's can receive the FBL-conducted signal by way of respective, programmably-actuated, acquisition points. A hollow, in-line triangle is used to represent such points. See the legend of FIG. 2B. In FIG. 2A, only one hard inject point and three soft acquisition points of bus 221 are shown for purpose of example. It is understood that the pattern repeats for each signal-sourcing CBB of VGB(2,2).

Adjacent VGB(2,3) has its own set of n1 feedback lines as represented by FBL bus 231. A result signal that is produced in a first CBB (or more primitive CBE sub-element of the CBB) may be routed to a nearby, next CBB without having to pass through a switchbox area (e.g., 251, 252) by moving that signal either through an adjacent interconnect line (AIL) such as in bus 222 or by moving that signal through an adjacent feedback line (FBL) such as in bus 221.

Another path for moving signals a relatively short distance without having to pass the signals through a switchbox area (e.g., 251, 252) is provided by direct connect lines (DCL's) such as 241. In one embodiment, each CBB has one DCL dedicated to it. The CBB to which the DCL is dedicated, can output signals onto that DCL by way of a hardwired, output connection. Each of a remaining plurality of CBB's connected to the DCL can receive the DCL-conducted signals by way of respective, programmably-actuated, acquisition points. A hollow, in-line triangle is used to represent such points. In FIG. 2A, only one DCL 241 is shown with its hard inject point coming from a bottom CBB of VGB (3,3). The DCL 241 can be thought of as having a cross-hair distribution structure that expands into four respective branches, 241a, 241b, 241c and 241d. Each signal-sourcing CBB has a similarly-distributed DCL for distributing the respective source signal to 16 neighboring CBB's.

In the case of DCL 241; which DCL originates from the bottom of VGB(3;3), a first branch 241a extends to the top two CBB's of VGB(4,3) and the bottom two CBB's of VGB(5,3). A second branch 241b of the same DCL extends to the bottom two CBB's of VGB(3,2) and the bottom two CBB's of VGB(3,1). A third branch 241c of the same DCL extends to the top two CBB's of VGB(2,3) and the bottom two CBB's of VGB(1,3). A fourth branch 241d of the same DCL extends to the bottom two CBB's of VGB(3,4) and the bottom two CBB's of VGB(3,5).

If result signals of SVGB(2,2–3,3) are to be distributed over longer distances, adjacent interconnect lines may be used from one or more of quad-length bus 223, octal-length bus 224, hexadecimal-length bus 225, maximum-length bus 228 and/or half-maximum-length bus 227.

As implied by its name, the quad-length bus 223 extends linearly over a distance corresponding to four VGB's. In the illustrated example, one end of 4×L bus 223 terminates in switchbox area 251. The plurality of n4 wires of bus 223 extend through switchbox area 252 to terminate in the next following switchbox area (not shown).

Figure 3:
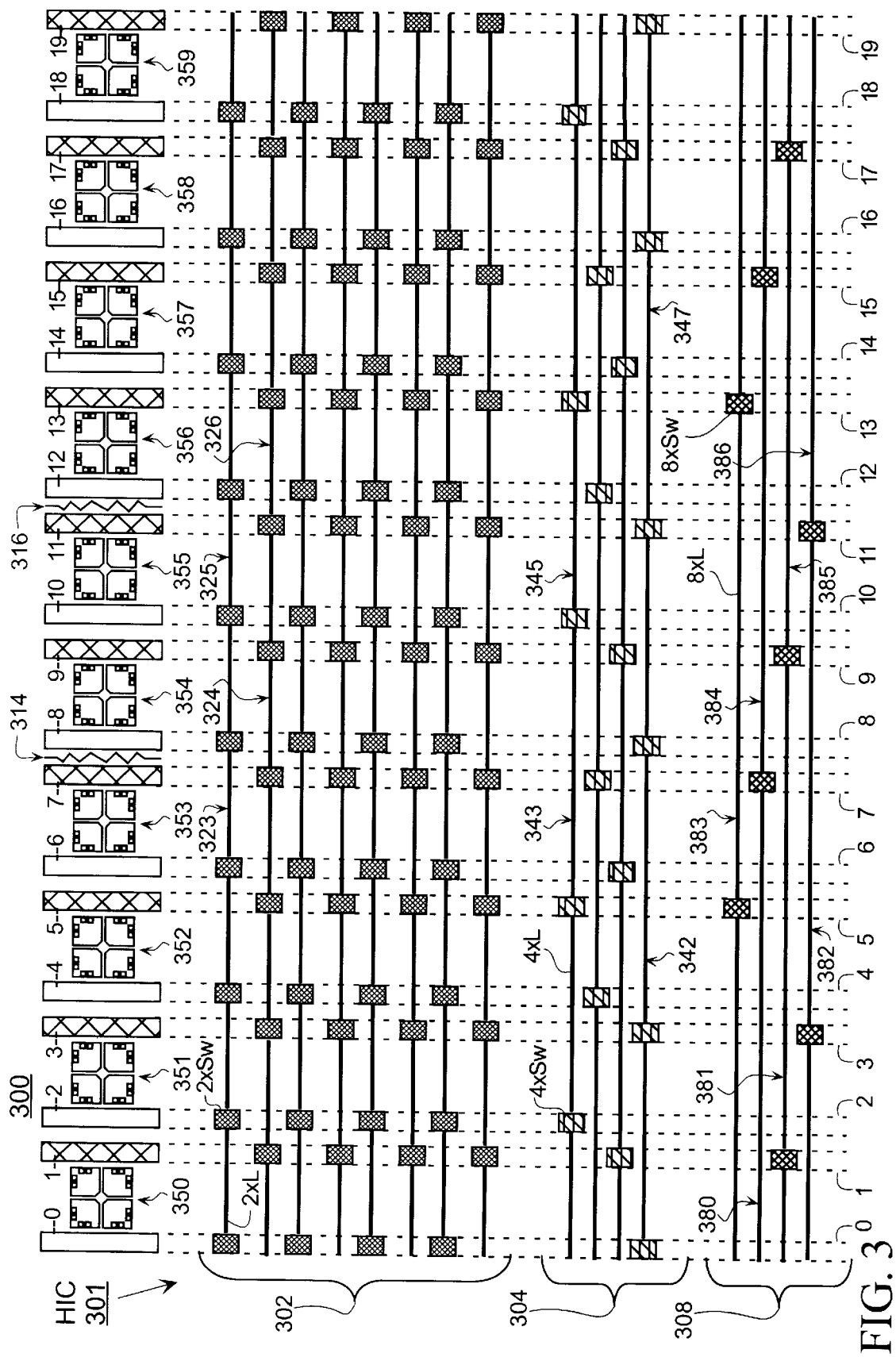
FIG. 3 schematically illustrates a switchbox staggering arrangement that may be used.

In one embodiment, the termination points of linear wires other than 2×L wires are staggered with respect to transmitting nibble-wide data words to or from the termination points. Such staggering relative to nibble-wide words for 4×L–8×L lines is shown in FIG. 3, which figure will be discussed shortly. Despite the nibble-wise, end-point staggering, a portion of the 4×L–8×L lines may still be used to transmitting nibble-wide data words between switchboxes that couple to nonterminal parts of the 4×L–8×L lines.

As implied by its name, the octal-length bus 224 extends linearly over a distance corresponding to eight VGB's. In the illustrated example, one end of 8×L bus 224 terminates in switchbox area 251. The plurality of n8 wires of bus 224 extend through switchbox area 252 to terminate in the switchbox area (not shown) that corresponds to bus 224 having extended continuously by and immediately adjacent to eight respective VGB's.

As implied by its name, the hexadecimal-length bus 225 extends linearly over a distance corresponding to sixteen VGB's. In the illustrated example, one end of 16×L bus 225 terminates in switchbox area 251. The plurality of n16 wires of bus 225 extend through switchbox area 252 to terminate in the switchbox area (not shown) that corresponds to bus 225 having extended continuously by and immediately adjacent to sixteen respective VGB's.

Depending on the size of the SVGB array, HIC bus 250' may contain yet further buses in the genre of buses 223–225. These further buses will be of the length type, N×L where N is equal to 32, 64, and so forth. In one embodiment, the highest value of N is 8, meaning that bus 225 is not present in that embodiment. The genre of buses 223–225 is characterized by bidirectional connection points for the sourcing of and acquisition of signals. Unfortunately, in one embodiment of this genre, there can be only one source point because the sources are not of a tristate or open collector type. Thus, once a wire is consumed for servicing one non-tristate source, it cannot be used for simultaneously servicing a second source.

To solve this problem of limited-use resources, HIC bus 250' may further contain tristateable lines such as those of maximum-length bus 228. As implied by its name, the maximum-length bus 228 extends linearly over a distance corresponding to a maximum number of VGB's in a corresponding direction (e.g., horizontal or vertical) of the array. In the illustrated example, neither end of MaxL bus 228 terminates in a switchbox area such as 251, 252. Both ends continue to couple into opposed IOB's (not shown). The plurality of nM wires of bus 228 may be used for carrying time-multiplexed signals having up to nM bits each. These signals may be injected from SVGB's that have respective tristate drivers connected to the MaxL lines. The signals of the MaxL lines may be acquired by immediately-adjacent CBB's through respective, programmably-actuatable acquisition points of those CBB's.

As implied by its name, the half-maximum-length bus 227 extends linearly over a distance corresponding to one half the maximum number of VGB's in a corresponding direction (e.g., horizontal or vertical) of the array. One end of 0.5MaxL bus 227 may terminate in a switchbox area such as 251, 252 while an opposed end continues to couple into an opposed IOB (not shown). The plurality of nH wires of bus 227 may be used for carrying time-multiplexed signals having up to nH bits each. These signals may be injected from SVGB's that have respective tristate drivers connected to the 0.5MaxL lines. The signals of the 0.5MaxL lines may be acquired by immediately-adjacent CBB's through respective, programmably-actuatable acquisition points of those CBB's.

Depending on the size of the SVGB array, HIC bus 250' may contain yet further buses in the genre of buses 228-227. These further buses will be of the length type, (1/M)×L where M is equal to 4, 8, and so forth. In one embodiment, the highest value of M is 2, meaning that a 0.25MaxL bus is not present in that embodiment. The genre of buses 228-227 is characterized by tristateable source points for the sourcing of injected signals and unidirectional acquisition points for acquiring such injected signals. Signal forwarding points may be included in the switchbox areas such as 251, 252 for forwarding signals of tristateable lines such as 228-227 onto other kinds of lines such as 2×L lines of bus 222. The numbers and length s of the additional, smaller lines should be kept small so as to not overload the tristate line-drivers that drive signals onto the tristateable wires.

In the embodiment of FIG. 3, switchboxes for continuing signals past the termination ends of respective 2×L, 4×L, and 8×L wires are staggered as one moves sequentially down the illustration. Core channels 1 through 18 are laid out as adjacent pairs of odd and even channels. Peripheral channels 0 and 19 run alone along side the IOB's (see FIG. 2C). Although not shown in FIG. 3, it should be understood that each switch box has both horizontally-directed and vertically-directed ones of the respective 2×L, 4×L, and 8×L lines entering into that respective switch box. A given switchbox (X×Sw) may be user-configured to continue a signal along to a next X×L line (e.g., 2×L line) of a same direction and/or to couple the signal to a corresponding same kind of X×L line of an orthogonal direction.

Group 302 represents the 2×L lines of HIC 301 and their corresponding switch boxes. For all of the 2×L lines, each such line spans the distance of essentially two adjacent VGB's (or one super-VGB). Most 2×L lines terminate at both ends into corresponding 2× switch boxes (2×Sw's). The terminating 2×Sw boxes are either both in even-numbered channels or both in odd-numbered channels. Exceptions may occur at the periphery where either an odd or even-numbered channel is nonexistent. As seen in the illustrated embodiment 300, interconnections can be made via switch boxes from the 2×L lines of HIC 301 to any of the odd and even-numbered vertical interconnect channels (VIC's) 0–19.

With respect to the illustrated placement 314/316 of embedded memory columns 214/216 (FIG. 2C), note in particular that 2×L line 323 and/or its like (other, similarly oriented 2×L lines) may be used to provide a short-haul, configurable connection from SVGB 353 (the one positioned to the right of VIC #6) to LMC 314 and to VIC's #6 and #8. Similarly, line 324 and its like may be used to provide a short-haul connection from SVGB 354 (the one positioned to the right of VIC #8) to LMC 314 and to VIC's #7 and #9. Line 325 and/or its like may be used to provide a short-haul connection from SVGB 355 to RMC 316 and to VIC's #10 and #12. Line 326 and/or its like may be used to provide a short-haul connection from SVGB 356 to RMC 316 and to VIC's #11 and #13. Such short-haul connections may be useful for quickly transmitting speed-critical signals such as address signals and/or data signals between a nearby SVGB (353–356) and the corresponding embedded memory column 214 or 216.

Group 304 represents the 4×L lines of HIC 301 and their corresponding switch boxes. Most 4×L lines each span the distance of essentially four, linearly-adjacent VGB's and terminate at both ends into corresponding 4× switch boxes (4×Sw's). The terminating 4×Sw boxes are one each in an even-numbered channel and an odd-numbered channel. As seen in the illustrated embodiment 300, interconnections can be made via switch boxes from the 4×L lines of HIC 301 to any of the odd and even-numbered vertical interconnect channels (VIC's) 0–19.

With respect to the illustrated placement 314/316 of embedded memory columns 214/216, note in particular that 4×L line 342 and/or its like (other, similarly oriented 4×L lines that can provide generally similar coupling) may be used to provide a medium-haul configurable connection between LMC 314 and either one or both of SVGB 352 and SVGB 353 as well as VIC's #3 and #8. Line 343 and/or its like may be used to provide a configurable connection of medium-length between LMC 314 and either one or both of SVGB's 353 and 354, as well as VIC's #5 and #10. Similarly, line 345 and/or its like may be used to provide medium-length coupling between RMC 316 and either one or both of SVGB's 355 and 356 as well as VIC's #10 and #13. Moreover, line 347 and/or its like may be used to configurably provide medium-haul interconnection between RMC 316 and either one or both of SVGB's 357 and 356 as well as VIC's #11 and #16. Such medium-haul interconnections may be useful for quickly propagating address signals and/or data signals in medium-speed applications.

Group 308 represents the 8×L lines of HIC 301 and their corresponding switch boxes. Most 8×L lines (7 out of 12) each spans the distance of essentially eight, linearly-successive VGB's. A fair number of other 8×L lines (5 out of 12) each spans distances less than that of eight, linearly-successive VGB's. Each 8×L line terminates at least one end into a corresponding 8× switch box (8×Sw). The terminating 8×Sw boxes are available in this embodiment only in the core odd-numbered channels (1, 3, 5, 7, 9, 11, 13, 15 and 17). Thus, in embodiment 300, interconnections can be made via switch boxes from the 8×L lines of HIC 301 to any of the nonperipheral, odd-numbered vertical interconnect channels (VIC's).

With respect to the illustrated placement 314/316 of embedded memory columns 214/216, note in particular that 8×L line 381 or its like may be used to provide even longer-haul, configurable connection from between LMC 314 and any one or more of SVGB's 351–354, as well as VIC's #1 and #9. In the illustrated embodiment, 8×L line 382 may be used to provide 8×L coupling between any two or more of: LMC 314 and SVGB's 352–355, as well as VIC's #3 and #11. Line 383 may be used to provide 8×L coupling between any two or more of: LMC 314, RMC 316, and SVGB's 353–356, as well as VIC's #5 and #13. Line 384 may be used to provide 8×L coupling between any two or more of: LMC 314, RMC 316, and SVGB's 354–357, as well as VIC's #7 and #15. Line 385 may be used to provide 8×L coupling between any two or more of: RMC 316 and SVGB's 355–358, as well as VIC's #9 and #17. Line 386 may be similarly used to provide 8×L coupling between any two or more of: RMC 316 and SVGB's 356–359, as well as VIC #11.

Figure 4B:
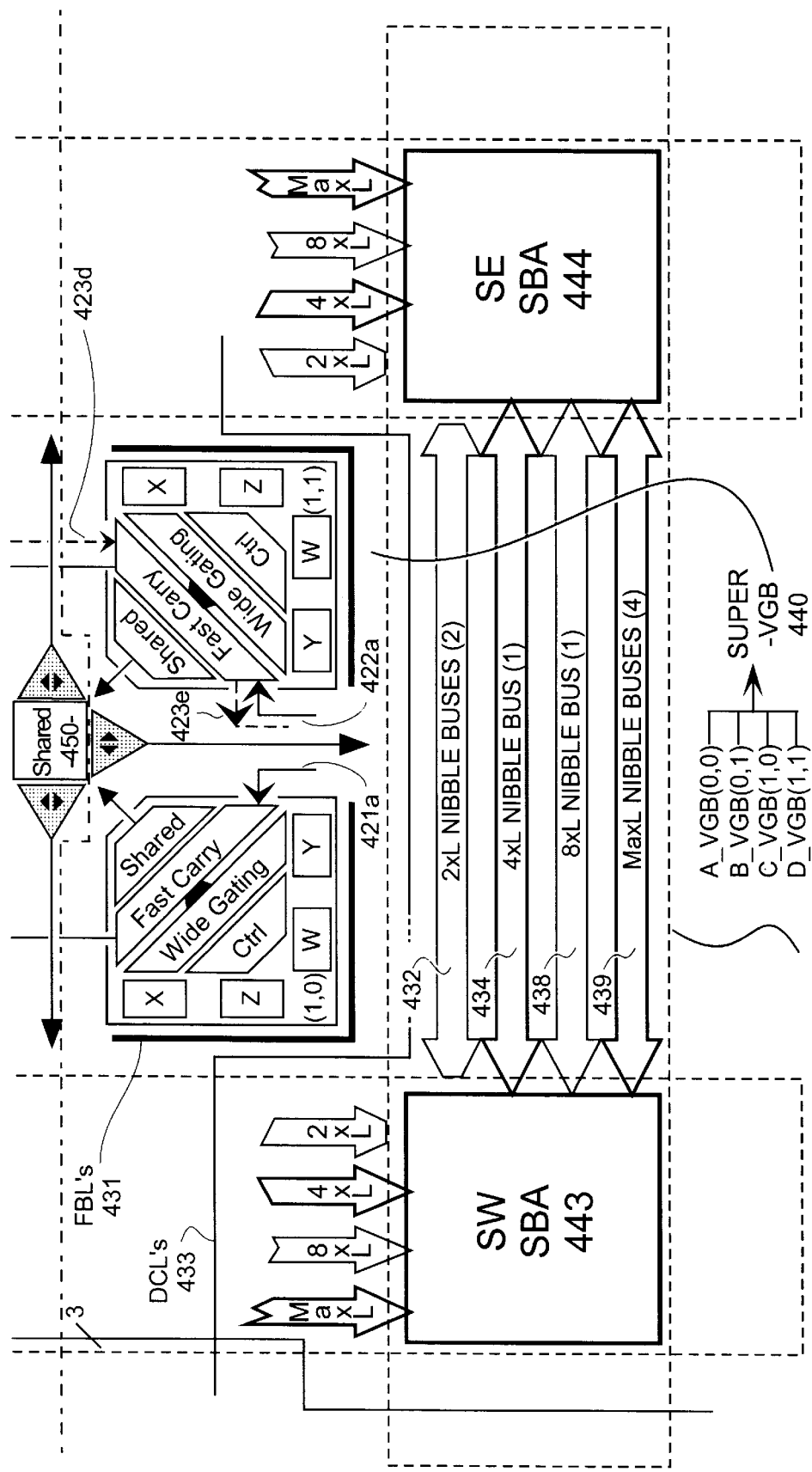
FIG. 4 illustrates a tiling layout that may be used.

Referring now to FIG. 4, this figure provides a mid-scopic view of some components within an exemplary matrix tile 400 that may be used for tiling a regular array such as shown in FIG. 2C. Of course, other implementations are possible for the more macroscopic view of FIG. 2C.

The mid-scopic view of FIG. 4 shows four VGB's brought tightly together (wedged together) in mirror opposition to one another. The four, so-wedged together VGB's are respectively designated as (0,0), (0,1), (1,0) and (1,1). The four VGB's are also respectively and alternatively designated herein as VGB_A, VGB_B, VGB_C, and VGB_D.

Reference number 430 points to VGB_A which is located near the northwest corner at relative VGB row and VGB column position (0,0). Some VGB internal structures such as CBB's Y, W, Z, and X are visible in the mid-scopic view of FIG. 4. An example of a Configurable Building Block is indicated by 410 (CBB X). As seen, the CBB's 410 of each VGB 430 are arranged in an L-shaped organization and placed near adjacent interconnect and intraconnect lines.

These adjacent interconnect lines (AIL's) include: (a) VGB intraconnect lines, which are also referred to as feedback lines (FBL's 431); (b) VGB-to-VGB dedicated interconnect lines, which are also referred to as direct connect lines (DCL's 433); (c) double-length buses 432; (d) quad-length buses 434; (e) octal-length buses 438;(f) maximum-length buses 439; and (g) global clock/reset lines 435.

Each of buses groups, 432, 434, 438, 439 includes one or more nibble buses. A nibble-bus is 4-lines wide and thereby matches the 4-bits wide data processing and storing capabilities of each VGB or linear group of 4 CBB's. It is within the contemplation of the invention to substitute byte-buses (8-lines wide) for the nibble-buses if the data processing and storing capabilities of each VGB is increased to 8 bits.

Each double-length buses group 432 that is adjacent to a side of a respective VGB 430 comprises 2 nibble-buses as indicated parenthetically in FIG. 4. Each quad-length buses group 434 that is adjacent to a side of a respective VGB comprises 1 nibble-bus. Each octal-length buses group 438 that is adjacent to a side of a respective VGB comprises 1 nibble-bus. Each maximum-length buses 439 that is adjacent to a side of a respective VGB comprises 4 nibble-buses. The L-shaped feedback lines group 431 about each respective VGB 430 comprises 8 L-shaped feedback lines (2 for each CBB within the VGB). Each CBB drives a respective DCL 433. Each DCL extends in a cross-hair pattern as shown at 433a. The DCL-driving CBB is at the center of the cross-hair pattern 433a while 8 driven VGB's are symmetrically distributed about the legs of the crosshair pattern 433a. Thus there are 2 VGB's capable of receiving signals from the respective DCL in each leg of the cross-hair pattern 433a. (See also FIG. 2A.) Because there are 4 wedged-together VGB's in tile 400, each with 4 CBB's, tile 400 drives 16 independent DCL's (not shown), where the driven DCL's 433 extend symmetrically from tile 400.

Aside from the CBB's (X, Z, W, and Y), further VGB internal structures are seen in FIG. 4 such as each VGB's common controls developing (Ctrl) section, each VGB's wide-gating supporting section, each VGB's carry-chaining (Fast Carry) section, and each VGB's coupling to a shared circuit 450 of a corresponding super-structure (super-VGB) 440.

The eight local feedback lines (FBL's) 431 of each VGB 430 allow for high-speed transmission from one CBB to a next within a same VGB, of result signals produced by each CBB. The four direct connect lines (DCL's) 433 of each VGB 430 (one for each CBB) allow for high-speed transmission from one VGB (at center of cross-hair pattern 433a) to eight neighboring VGB's of result signals produced by each DCL-driving Configurable Building Block (CBB X, Z, W, and Y).

The mid-scopic view of FIG. 4 additionally shows tile 400 as including respective parts of four interconnect channels surrounding VGB's (0,0) through (1,1). The top and bottom, horizontally extending, interconnect channels (HIC's) are respectively identified as 451 and 452. The left and right, vertically extending, interconnect channels (VIC's) are respectively identified as 461 and 462. Each interconnect channel has a same number and mirror-symmetrical distribution of interconnect lines and switchboxes, with the exception of the global reset/set line (GR) which is found only in each of the VIC's but not in the HIC's.

Switchboxes are formed in mirror symmetrical switchbox areas (SBA) where the SBA's 441, 442, 443 and 444 are respectively formed in the NW, NE, SW and SE corners of the tile 400. SBA's 441, 442, 443 and 444 are organized in mirror image relationship to one another relative to corresponding vertical and horizontal centerlines (not shown) of tile 400.

As seen broadly in FIG. 4, the group of four VGB's, (0,0) through (1,1) are also organized in mirror image relationship to one another relative to corresponding vertical and horizontal centerlines (not shown) of the group and even to some extent relative to diagonals (not shown) of the same group. Vertical and horizontal interconnect channels (VIC's and HIC's) do not cut through this mirror-wise opposed congregation of VGB's. As such, the VGB's may be wedged-together tightly.

With respect to mirror symmetry among variable grain blocks, VGB (0,1) may be generally formed by flipping a copy of VGB (0,0) horizontally. VGB (1,1) may be similarly formed by flipping a copy of VGB (0,1) vertically. VGB (1,0) may be formed by flipping a copy of VGB (1,1) horizontally, or alternatively, by flipping a copy of VGB (0,0) vertically. The mirror-wise symmetrical packing-together of the four VGB's (0,0 through 1,1) is referred to herein as a 'Super Variable Grain Block' or a super-VGB 440.

In a preferred embodiment, the mirror symmetry about the diagonals of the super-VGB is not perfect. For example, there is a Fast Carry section in each VGB that allows VGB's to be chained together to form multi-nibble adders, subtractors or counters. (A nibble is a group of 4 data bits. A byte is two nibbles or 8 data bits. A counter generally stores and feeds back its result so as to provide cumulative addition or subtraction.) The propagation of rippled-through carry bits for these Fast Carry sections is not mirror wise symmetrical about the diagonals of each super-VGB 440. Instead it is generally unidirectional along columns of VGB's. Thus, CBB's X, Z, W, and Y are not interchangeable for all purposes.

The unidirectional propagation of carry bits is indicated for example by special direct connect lines 421a, 421b and 421c which propagate carry bits upwardly through the Fast Carry portions of VGB's (0,0) and (1,0). The unidirectional propagation is further indicated by special direct connect lines 422a, 422b and 422c which propagate carry bits upwardly through the Fast Carry portions of VGB's (0,1) and (1,1).

Such unidirectional ripple-through of carry bits may continue across the entire FPGA device so as to allow addition, subtraction or count up/down results to form in bit aligned fashion along respective columns of the FPGA device. Bit aligned results from a first set of one or more columns can be submitted to other columns (or even resubmitted to one or more columns of the first set) for further bit aligned processing. In one embodiment, the X CBB generally produces the relatively least significant bit (LSB) of result data within the corresponding VGB, the Z CBB generally produces the relatively next-more significant bit, the W CBB generally produces the relatively next-more significant bit, and the Y CBB generally produces the relatively most significant bit (MSB) of result data within the corresponding VGB. The carry-in bit in the lowest CBB of each column may be fixed such as by grounding or may be made configurable such by setting it with a corresponding configuration memory cell (not shown).

In an alternate embodiment, propagation of rippled-through carry bits may be zig-zagged first up and then down through successive columns of VGB's. In such an alternate zig-zagged design, the significance of bits for adder/subtractor circuits would depend on whether the bits are being produced in an odd or even column of VGB's.

The local feedback lines 431 of each VGB may be used to feedback its registered adder outputs to one of the adder inputs and thereby define a counter. The counter outputs can be coupled by way of the adjacent HIC to a next column of VGB's.

FIG. 4 is provided to facilitate the understanding of the coupling that is provided by way of the HIC's and VIC's between corresponding inputs and outputs of the super-VGB's (440). It is helpful to study the I/O structure of selected components within each super-VGB to some extent so that the data-width matching and diversified-reach aspects of the interconnect can be appreciated. At the same time, it is to be understood that the description given here for internal elements of the SVGB's is less extensive than that given in the above-cited Ser. No. 08/948,306.

Each of the X, Z, W, and Y Configurable Building Blocks has six 19:1, input-terms acquiring multiplexers for acquiring a corresponding six input term signals of the CBB. The CBB can process the acquired signals in accordance with user-configuration instructions to produce result signals. Each of the X, Z, W, and Y CBB's further has a result-signal storing register (not shown) and a 2/4/8×L drive amplifier for configurably outputting either a register-stored version of a CBB result signal or a nonstored (unregistered) result signal of the CBB onto adjacent ones of the 2×L lines, 4×L lines and 8×L lines. Control signals may be used by the CBB for controlling its internal, result-signal storing register (not shown). These control signals are acquired by way of respective, controls input multiplexers (14:1 Ctrl) of the respective CBB's X,Z,W,Y. There are two such controls input multiplexers (14:1 Ctrl) provided for each CBB.

In addition to its 2/4/8×L drive amplifier (not shown) each of the X, Z, W, and Y CBB's further has a dedicated direct-connect (DC) drive amplifier (not shown) for configurably outputting either a register-stored version of a CBB result signal or an nonstored (unregistered) result signal of the CBB onto adjacent ones of so-called, direct connect lines. Moreover, each CBB has means for outputting its registered or unregistered result-signals onto feedback lines (FBL's) of the VGB.

Figure 5A:
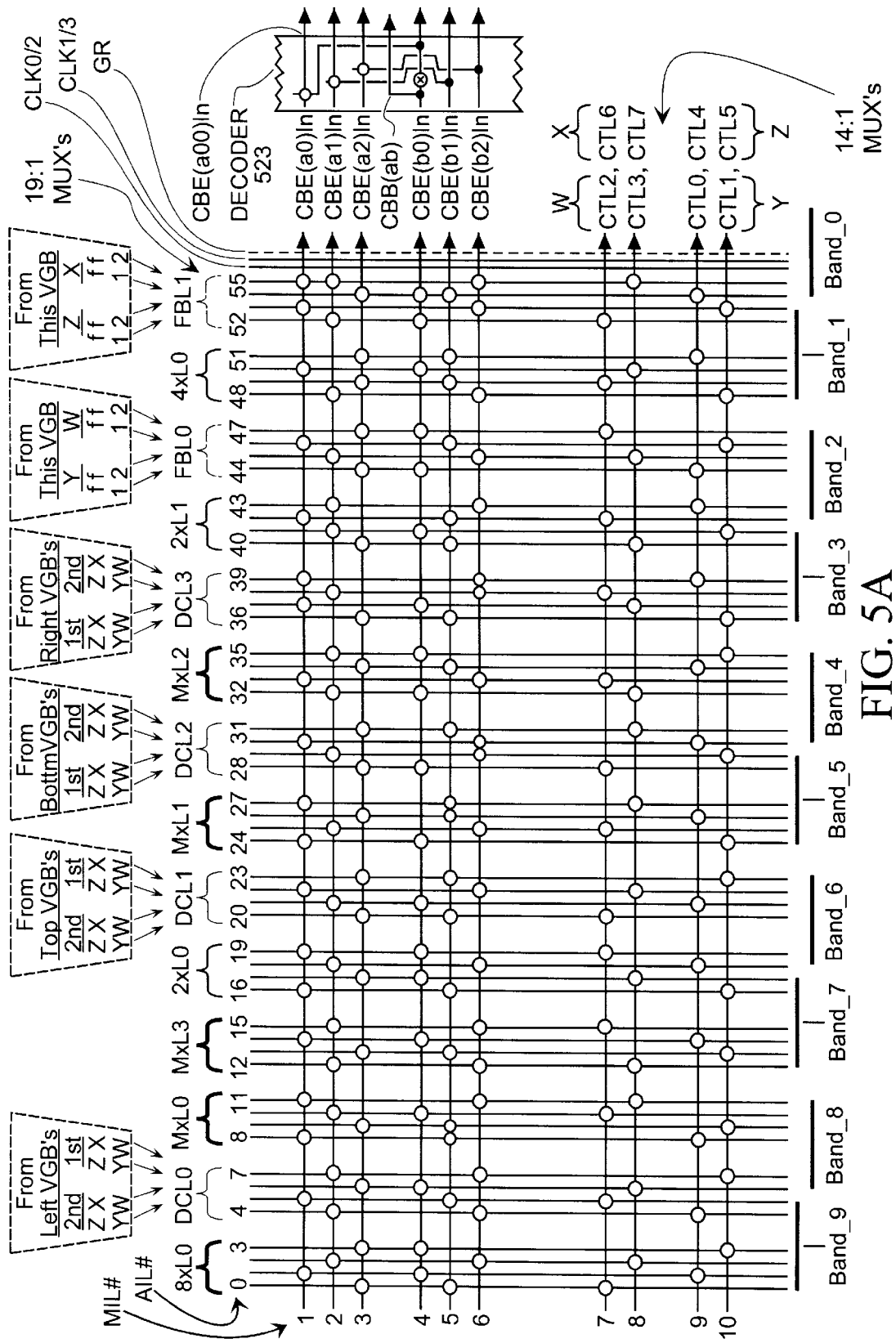
FIG. 5A schematically illustrates details of a PIP arrangement.

FIG. 5A illustrates a partial-populating scheme for the input-term and control-signal acquiring multiplexers of the respective X, Z, W, and Y CBB's of one embodiment in accordance with the invention. The adjacent interconnect lines (AIL's) are respectively numbered as #0 through #55. There are two dedicated clock (CLK) lines in each interconnect channel and one additional, global reset (GR) line in each VIC that are not included in this count. In one embodiment, AIL's 0–55 represent interconnect lines in the most immediately adjacent channel for each of CBB's X, Z, W, and Y.

In an alternate embodiment, AIL's 0–55 represent interconnect lines in the most immediately adjacent channel for each of CBB's X and Y while for the other CBB's, Z and W, the AIL's 0–55 of FIG. 5A represent the interconnect lines of the next adjacent channel. The exception is at the periphery of the matrix (see FIG. 2C) where there is no next adjacent channel, in which case AIL's 0–55 represent interconnect lines in the most immediately adjacent channel also for CBB's Z and W. This alternate configuration allows each VGB to acquire input term signals and control signals from both the even-numbered and odd-numbered interconnect channels that surround it. It is of course within the contemplation of the invention to have other configurations, such as for example wherein the CBB's that reach the most immediately adjacent channel are X and W rather than X and Y; and such as wherein the CBB's that reach the next adjacent channel are X and Y rather than Z and W.

Multiplexer input lines (MIL's) are numbered in FIG. 5A as 1 through 10. MIL's 1–3 correspond to the three 19:1 input term acquiring multiplexers of a first LUT (e.g., 'a') in each of the X, Z, W, Y CBB's. MIL's 4–6 correspond to the three 19:1 input term acquiring multiplexers of a second LUT (e.g., 'b') in each of the X, Z, W, Y CBB's. MIL's 7–8 correspond to the two 14:1 control signal acquiring multiplexers of each of the W and X CBB's. MIL's 9–10 correspond to the two 14:1 control signal acquiring multiplexers of each of the Y and Z CBB's. MIL's generally have substantially lower capacitance than do AIL's and thus do not contribute in any significant way to the delay of acquired signals.

The illustrated partially-populated distribution of PIP's over the intersections of AILS's 0–55 and MIL's 1–10 should be self-explanatory. User-programmable PIP's are shown as hollowed circles. They provide respective means for acquiring input logic bits (be they input term or control bits) into the corresponding CBB. These on-the-MIL PIP's correspond to the programmably-wired signal acquisition points that are represented in FIG. 2B as on-line hollow triangles. These on-the-MIL PIP's also correspond to the programmably-wired signal acquisition parts of bidirectional points that are represented in FIG. 2B as on-line hollow diamonds.

AIL's 0–3 represent the four 8×L lines (the octal-length nibble bus) in each general interconnect channel (VIC or HIC). AIL's 4–7 represent a first group (DCL0) of four of the 16 direct connect lines in each such interconnect channel. The remaining DCL's are represented by the 20–23 (DCL1), 28–31 (DCL2) and 36–39 (DCL3) sets of AIL's. AIL's 8–11 represent a first group (M×L0) of four of the 16 MaxL lines in each general interconnect channel. The remaining M×L's are represented by the 24–27 (M×L1), 32–35 (M×L2) and 12–15 (M×L3) sets of AIL's.

AIL's 16–19 represent a first group (2×L0) of four of the 8 2×L lines (a first double-length nibble bus) in each interconnect channel. The other four 2×L lines are represented by the 40–43 (2×L1) group. AIL's 44–47 represent a first group (FBL0) of four of the 8 local feedback lines that may be considered as extending into each interconnect channel for purpose of intra-VGB communication. The other four feedback lines are represented by the 52–55 (FBL1) group. AIL's 48–51 represent the four 4×L lines (the quad-length nibble bus) in each interconnect channel.

The VIC's further include clock longlines CLK0 and CLK1 as well as global reset line GR. The HIC's further include CLK2 and CLK3 but not GR. The globally-distributed signals of CLK0–CLK3 may sourced from outside the chip or generated by on-chip PLL's (phase lock loops). The PLL phase may be offset to counter system clock skew. The shared control section of each VGB 430 acquires clock and reset signals from the adjacent control lines CLK0–CLK3 and GR and distributes derived control signals for the VGB from these.

Signal sources for the direct connect lines and the feedback lines are indicated respectively above corresponding AIL groups, In group DCL0 for example, AIL #7 is driven by either the X or the W DC driver of the neighboring VGB that is immediately to the left of the current VGB. AIL #6 is driven by either the Z or the Y DC driver of the neighboring VGB that is immediately to the left of the current VGB. AIL #5 is driven by either the X or the W DC driver of the next, not immediately-neighboring VGB that is to the left of the current VGB. AIL #4 is driven by either the Z or the Y DC driver of the next-adjacent VGB that is to the left of the current VGB.

Each of MIL's 1–6 is loaded by essentially the same number of 19 PIP's that form the corresponding 19:1 multiplexer. As such, there is roughly a same amount of signal propagation delay in going through each such multiplexer to the corresponding LUT. There is some additional delay or loading from PIP's and POP's that form the intervening decoder layer between the input term acquiring multiplexers and the LUT's of the respective CBB. A representative part of that decoder layer is shown at 523.

Note that for each of AIL's 0–55 there are at least two PIP connections to two different MIL's, one of which is placed in the MIL# 1–3 set and another of which is in general, differently placed in the MIL# 4–6 set. In other words, are at least two possible MIL's which can be used to acquire an input term signal moving along a given AIL and feed the acquired signal to one or the other of two possible LUT's ('a' or 'b'). Thus if one of the two 19:1 multiplexers that can couple to a given AIL is already consumed, or the corresponding LUT is already consumed, the FPGA configuring software has the possibility of alternatively using the other multiplexer and/or LUT for implementing a circuit chunk that requires a particular input term signal moving along the given AIL.

Each of AIL's #54 and #55 has at least three PIP connections to a respective three different MIL's. Feedback signals from the f1 and f2 lines of the X CBB output therefore have 3 possible ways of being transmitted into the respective MIL 1–6 inputs of any one of the X, Z, W, and Y Configurable Building Blocks of the same VGB. These MIL 1–6 inputs are alternatively named as CBE(a0)In, CBE(a1)In, CBE(a2)In, CBE(b0)In, CBE(b1)In, and CBE(b2)in FIG. 5A. Note that CBE(b0)In is different from the others in that a POP (Programmable Opening Point) is provided for it in decoder section 523. CBB(ab) represents an intercepted signal that may be used for compounding or folding together the 'a' and 'b' parts of the corresponding CBB. Such compounding is beyond the focus of the present disclosure and will not be described further except to mention that it enables the conversion of two 3-input LUT's ('a' and 'b') into a 4-input or higher LUT.

The basic message of FIG. 5A as presented here is to identify the AIL numbers of different kinds of interconnect lines and to show how such AIL's (adjacent interconnect lines) can supply data and/or controls to each CBB.

Figure 5B:
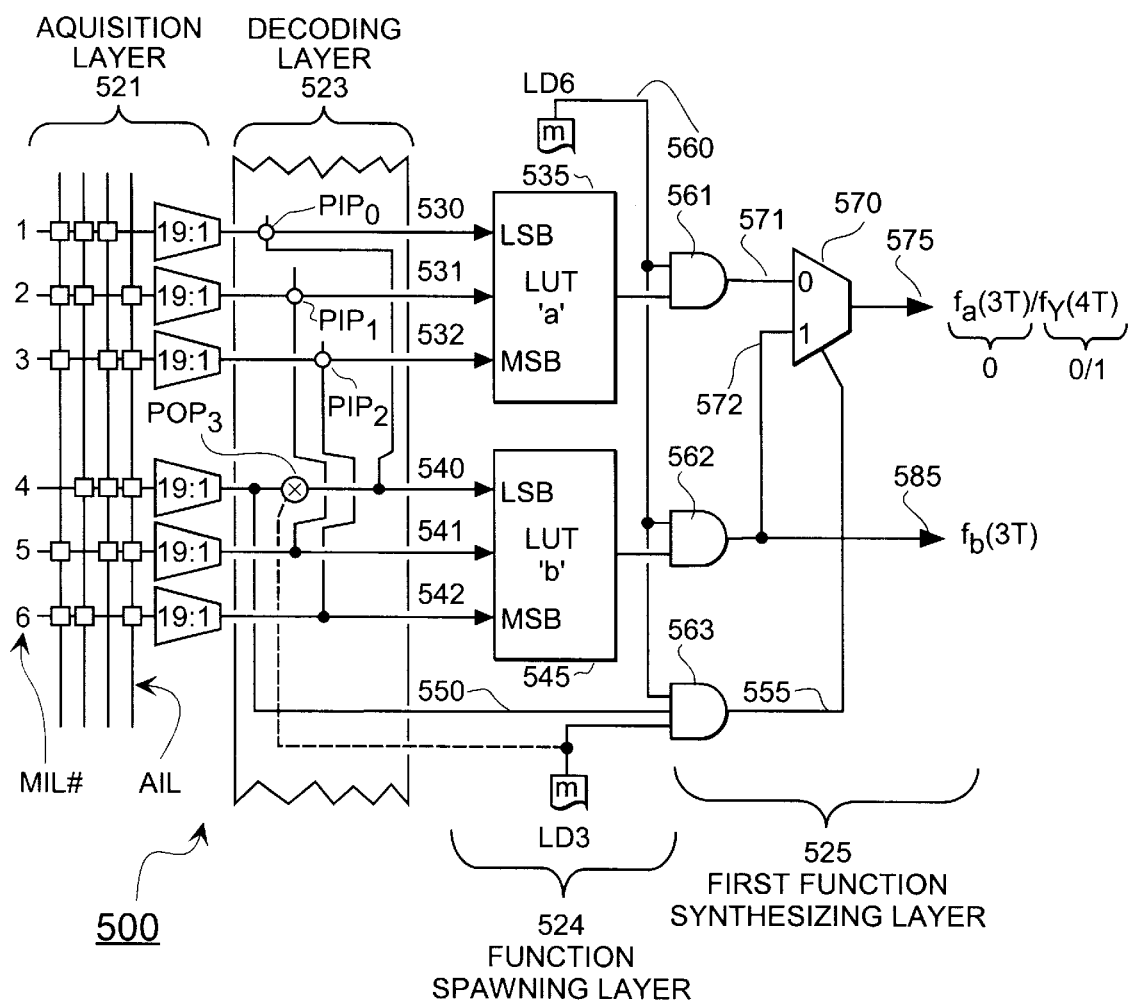
FIG. 5B illustrates a basic, variable grain circuit.

FIG. 5B illustrates a basic, variable grain circuit within each CBB. Referring to FIG. 5B, the same representative part of the decoding layer that was shown in FIG. 5A is again seen at 523. The next layer after the decoding layer 523 is named here as a function spawning layer 524. This function spawning layer 524 contains a set of function spawning lookup tables (UP-LUT's 535 and 545). Each of UP-LUT's 535 and 545 is user programmable. A first function synthesizing layer is shown at 525 as being coupled to both the decoding layer 523 and the function spawning layer 524. Functions of the 'a' and 'b' LUT's (535 and 545) may be programmably folded-together, as will be explained, to synthesize a higher order function. The circuit 500 of FIG. 5B represents a function generating part of a CBB. Each VGB and SVGB has deeper function synthesizing layers (not shown) for further folding-together the outputs of the first function synthesizing layers of respective CBB's to synthesize yet higher order functions. Details concerning such folding-together operations and concerning the deeper synthesizing structures of SVGB's may be found in at least one of the above-cited patent applications.

The input-term signals acquiring layer of CBB circuit 500 is shown at 521 to include the 19:1 static multiplexers formed on respective MIL's (fingers) 1–6. MIL's 1–6 can supply a respective subset of six or fewer acquired signals to decoding layer 523.

Decoding layer 523 includes first through third programmable interconnect points, PIP$_0$, PIP$_1$ and PIP$_2$. The corresponding configuration memory bits of these PIP's are not shown. PIP$_0$ may be used for programmably establishing a link between LUT input line 530 and LUT input line 540. PIP$_1$ may be used for programmably establishing a link between line 531 and line 541. PIP$_2$ may be used for programmably establishing a link between line 532 and line 542.

Decoding layer 523 further includes a programmable opening point designated as POP$_3$. The corresponding configuration memory bit of POP$_3$ is shown at LD3 and the controlling connection from LD3 to POP$_3$ is indicated by a dashed line. POP$_3$ may be used for programmably breaking a connection between MIL# 4 and LUT input line 540. Since each of PIP$_0$, PIP$_1$, PIP$_2$ and POP$_3$ is independently configurable, a number of different operating modes are possible.

In a first mode (the transparent decoding mode), all of PIP's 0, 1 and 2 are deactivated so as to not make respective connections between lines 530 and 540, between lines 531 and 541, between lines 532 and 542. POP 3 is also deactivated so as to not create a respective opening between MIL# 4 and line 540. The respective 3 output signals of the top three 19:1 multiplexers (MIL's 1–3) then couple to the respective 3 input terminals (530–532) of LUT 535 in this transparent decoding mode. At the same time, the respective 3 output signals of the bottom three 19:1 multiplexers (MIL's 4–6) couple to the respective 3 address input terminals (540–542) of LUT 545. Note for the case where PIP's take on the bidirectional configuration, that the capacitive loads of each of MIL's 1–3 are not added to the capacitive loads of respective ones of MIL's 4–6 in the transparent decoding mode. Thus propagation times for input term signals acquired from the adjacent interconnect lines (AIL's) to the inputs of LUT's 'a' (535) and 'b' (545) can be relatively small.

Note that the number of 19:1 multiplexers (MIL's 1–6) matches the number of independent LUT inputs, 530–532 and 540–542. When the transparent decoding mode is active, each 19:1 multiplexer of the acquisition layer 521 is efficiently consumed by a corresponding one of LUT inputs, 530–532 and 540–542. Thus there is a balanced match of signal acquiring resources (521) and signal consuming resources (524) when the transparent decoding mode is active.

In the transparent decoding mode, LUT 535 produces a three input-term, $f_a(3T)$ function signal in response to its respective 3 inputs as fed in from MIL's 1–3. LUT 545 produces a $f_b(3T)$ function signal in response to its respective 3 inputs as fed in from MIL's 4–6.

The first function synthesizing layer 525 includes first through third AND gates 561–563, a dynamic multiplexer 570 and a default line 560 that is driven by configuration memory bit LD6. Each of AND gates 561–563 has an input connected to default line 560 so that a logic 0 in configuration memory bit LD6 forces logic 0 outputs from AND gates 561–563. (An alternate embodiment could use OR gates and reverse logic, of course.) Configuration memory bit LD6 should be set to logic 1 when circuit section 500 is being used for a function spawning process.

On the other hand, if section 500 is not being used, LD6 should be set to the logic 0 state by the FPGA configuring software and at the same time, all the MIP's of the corresponding 19:1 multiplexers should be left open (inactivated). This provides advantages. First, the FPGA configuring software does not have to spend significant time tying up loose ends for unused sections so as to eliminate switching noise from such loose ends. Second, the capacitive loadings of MIL's 1–6 are not added to the overall capacitances of the adjacent interconnect lines (AIL's). Third, elements of unused sections such as the LUT's may be placed in a power-saving, high impedance state.

As explained above, configuration memory bit LD3 is at logic 0 in the transparent decoding mode. One input of AND gate 563 is driven by bit LD3. Output 555 of AND gate 563 therefore drives the select control terminal of multiplexer 570 to output the signal of its '0' input 571, which input passes through AND gate 561 from the output of LUT 535. Dynamic multiplexer 570 therefore outputs the $f_a(3T)$ signal onto line 575 when the transparent decoding mode is present and LD6 is active (set to logic 1). At the same time, AND gate 562 outputs the $f_b(3T)$ signal onto line 585. Signals $f_a(3T)$ and $f_b(3T)$ are of course determined by user-configuration of the configuration memory bits in LUT's 'a' and 'b'. One such possible configuration is to make each of LUT's 'a' and 'b' behave as a 2:1 dynamic multiplexer.

In a second mode (the fully-strapped decoding mode), each of PIP$_0$, PIP$_1$, and PIP$_2$ is activated so as to make respective connections between line 530 and 540, between line 531 and 541, between line 532 and 542. POP$_3$ is also activated so as to create a respective opening between MIL# 4 and line 540. The respective 3 output signals of the top three 19:1 multiplexers (MIL's 1–3) may then couple to the respective 3 input terminals (530–532) of LUT 535 and also to the respective 3 input terminals (540–542) of LUT 545 in this fully-strapped decoding mode. The MIP's (Multiplexer Input Points, each of which are represented by a square unshaded box) of 19:1 multiplexers 5 and 6 should be left deactivated (not connecting) in this mode. One MIP of 19:1 multiplexer 4 (MIL# 4) should be activated to bring an acquired input term signal onto line 550. The combination of MIL #1 through MIL #4 can then define the four inputs of a synthesized LUT having four independent input terms. The signal of MIL #4 passes through AND gate 563 to toggle the select control line 555 of dynamic multiplexer 570. This toggling between logic 0 and logic 1 (0/1) produces the four-input term function, fy(4T).

As a slight variation on the above mode, the corresponding MIP's of either one of 19:1 multiplexers #2 and #3 is left deactivated (not connecting) while a MIP in a respective one of 19:1 multiplexers #5 and #6 is activated. The combinations of possibilities means that the input term signal acquiring capabilities of MIL's #2 and #5 are folded together and that the input term signal acquiring capabilities of MIL's #3 and #6 are folded together. As seen in FIG. 4, MIL# 5 may acquire input term signals from adjacent interconnect lines different than those serviced by MIL# 2. Similarly, MIL# 6 may acquire input term signals from adjacent interconnect lines different than those serviced by MIL# 3.

AND gate 563 couples the acquired input term signal of line 550 to the select control terminal of dynamic multiplexer 570 in this fully-strapped decoding mode. The second input 572 of multiplexer 570 is coupled to line 585. Output line 575 accordingly produces $f_a(3T)$ when the acquired input term signal of line 550 is logic 0 and it produces $f_b(3T)$ when the acquired input term signal of line 550 is logic 1. With appropriate use of the signal on MIL# 4 as the most significant address bit for a desired 16-bit LUT and the signals on MIL's 1–3 as the less significant address bits, section 500 functions as a 16-bit LUT that outputs $f_y(4T)$ on line 575 in this fully-strapped decoding mode. The emulated 16-bit LUT has input term acquiring capabilities greater than those of the individual 'a' and 'b' LUT's because of the exchangeability of 19:1 multiplexers #2 and #5, and because of the exchangeability of 19:1 multiplexers #3 and #6.

In the fully-strapped decoding mode, output line 585 continues to output the $f_b(3T)$ function signal. As such, for overlapping ones of $f_y(4T)$ and $f_b(3T)$, section 500 can simultaneously function as both a 16-bit LUT that outputs $f_y(4T)$ and an 8-bit LUT that outputs $f_b(3T)$.

Figure 6:
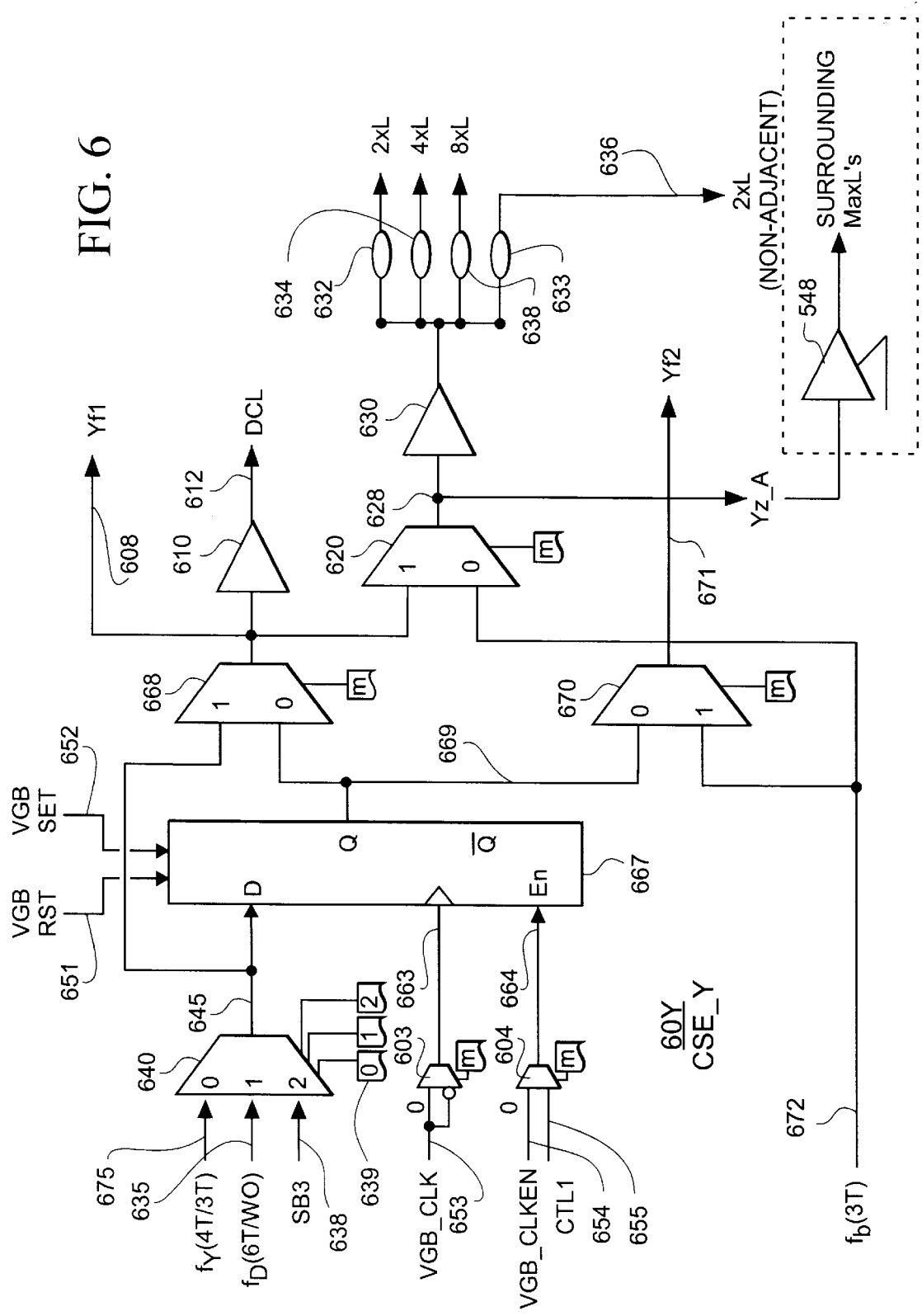
FIG. 6 is a schematic of a Configurable Sequential Element (CSE) which may be used in each Configurable Building Block (CBB) of the embodiment of FIG. 4.

In FIG. 6, the outputs of the primitive, 3:1 UP-LUT's ('a' and 'b') may respectively appear on lines 675 and 672 as signals $f_a(3T)$ and $f_b(3T)$. The output of a synthesized 4:1 UP-LUT may appear on line 675 as signal $f_y(4T)$. The output of a synthesized 6:1 UP-LUT may appear on line 635 as signal $f_D(6T)$. The synthesized signal, $f_D(6T)$ may be produced by folding together the function-generating resources of four CBB's, each CBB being similar to the structure shown in FIG. 5B.

Each CSE includes a data storing flip-flop 667. Flip-flop 667 receives reset (RST) and set control signals 651 and 652 in addition to clock signal 663 and clock enable signal 664. A locally-derived control signal CTL1 is represented at 655 while a VGB common enable is presented on line 654. Multiplexer 604 is programmably configurable to select one or the other of lines 654, 655 for presentation of the selected input signal onto output line 664. Lines 672, 675, 635 and 638 carry logic block (CBB) result signals which are not directly germane to the present invention. A more detailed explanation of such CBB-result signals may be found in at least one of the above-cited, copending applications.

Three bits of configuration memory are indicated at 639 for controlling multiplexer 640 to select an appropriate data signal 645 for supply to the D input of flip-flop 667. The selected signal may bypass the flipflop by routing through multiplexer 668 to line 608. Multiplexer 668 may be programmed to alternatively apply the Q output of flip-flop 667 to line 608. Buffer 610 drives a direct-connect line 612. Buffer 630 drives one or more of CBB-adjacent 2×L, 4×L or 8×L lines. Connection 636 is to a non-adjacent 2×L line. Items 632, 633, 634 and 638 represent PIP-like, programmable connections for programmably interconnecting their co-linear lines. Connection 648 is to a set of SVGB-shared tristate drivers (548) that connect to surrounding MaxL lines. A more detailed explanation of the CSE structure and its other components may be found in at least one of the above-cited, copending applications.

In summary, one embodiment of the invention features a plurality of different kinds of interconnect resources wherein each general channel, such as the illustrated example in FIG. 5A, contains the following resources: eight double-length (2×L) linear lines, four quad-length (4×L) linear lines, four octal-length (8×L) linear lines, sixteen full-length (MaxL) linear lines, sixteen direct-connect (DC) lines each having an other than fully-linear topology such as a cross-hair distribution pattern, eight feedback (FB) lines each having an other than fully-linear topology such as an L-shaped distribution pattern, and two dedicated clock (CLK) lines. Vertical ones of the general interconnect channels (VIC's) contain an additional global reset (GR) longline. Each of the 2×L, 4×L, 8×L and MaxL line sets includes at least four lines of its own kind for carrying a corresponding nibble's worth of data or address or control signals in the corresponding direction (horizontal x or vertical y) The channel does not contain single-length, linear lines. The channel does not contain switchbox areas that are spaced apart by a single-length. Thus, the delays and other inefficiencies (e.g., consuming more space in the IC) of single-length repetitions of switchbox areas are eliminated.

Figures 2, 2C:
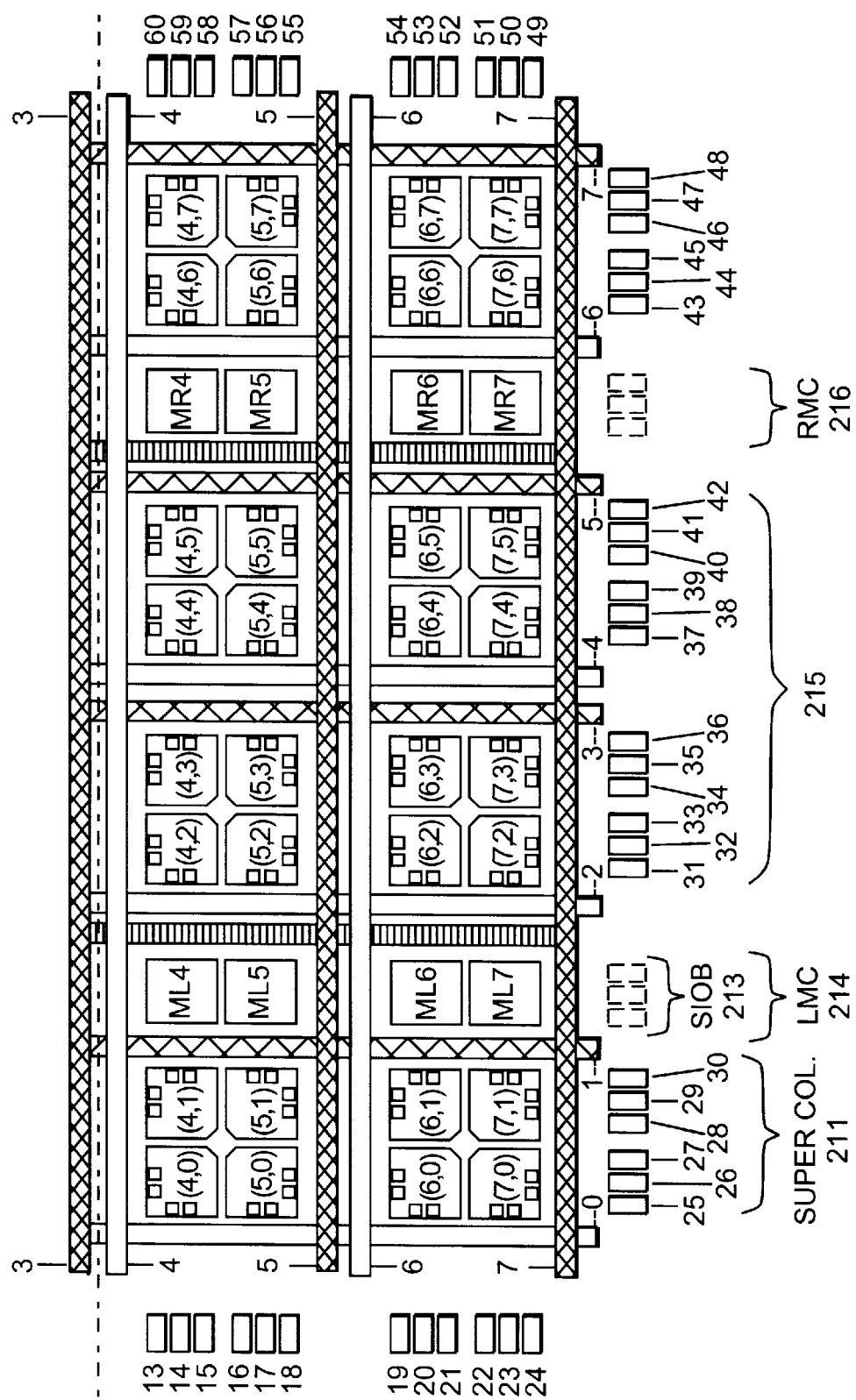
Figure 7A:
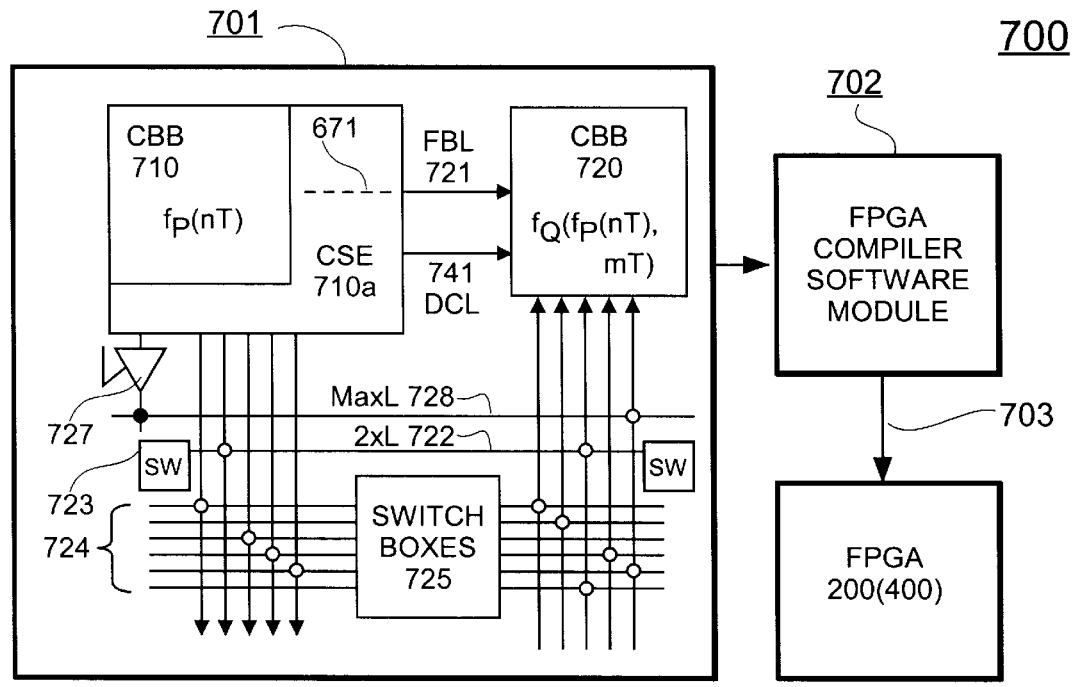
FIG. 7A is a schematic diagram of an FPGA configuring process.

Referring to FIG. 7A, a schematic diagram 700 is provided of an FPGA configuring process wherein a predefined design definition 701 is supplied to an FPGA compiling software module 702. Module 702 processes the supplied information 701 and produces an FPGA-configuring bitstream 703. Bitstream 703 is supplied to an FPGA such as 200 or 400 of respective FIGS. 2 and 4 for accordingly configuring the FPGA.

The design definition 701 may include a to-be-shared first function block 710 that produces a first result signal of the form, $f_P(nT)$, where P is an arbitrary function identifier and nT represents a corresponding number of independent input terms that are to-be acquired and processed to produce the first result signal, $f_P(nT)$.

Design definition 701 may further include a second function block 720 that produces a second result signal of the form, $f_Q(f_P(nT)\ mT)$, where Q is an arbitrary function identifier and mT represents a corresponding number of independent input terms which, in addition to the first result signal, $f_P(nT)$, are to-be-acquired and processed to produce the second result signal, $f_Q(f_P(nT),mT)$.

Although it may appear from the drawing that function modules 710 and 720 are pre-ordained to respectively correspond to CBB's (or VGB's) that are operatively coupled together by way of a particular, preselected one of interconnect resources such as FBL 721, DCL 741, MaxL line 728, 2×L line 722, or other lines 724 and intervening switch boxes 725; that is not inherently true. The design definition 701 may be originally expressed in a variety of ways which do not pre-ordain such an outcome.

Modern circuit designs typically start with a Very High-level Descriptor Language (VHDL) or the like for defining the behavior of a to-be-implemented design at a level that is significantly higher than a gate-level or transistor level description. High level design definitions are often entered by designers into computer-implemented programs that are commonly referred to by names such as VHDL synthesis tools. The output of the VHDL synthesis tools may be in the form of one or more computer files that constitute VHDL descriptions of the to-be-implemented design. VHDL description files may include one or more different kinds of constructs including VHDL Boolean constructs that define part or all of the design. The complexity of the Boolean functions can span a spectrum having very simple ones (e.g., those having 1–3 input terms) at one end to very complex ones at the other end. The high level definitions generally do not specify implementational details. That job, if an FPGA is to be used for implementation, is left to the FPGA compiler software module 702.

In performing various partitioning, placement and routing analyses, the FPGA compiler software module 702 may come to realize that the number of nT input term signals needed for producing the first result signal, $f_p(nT)$, may be more efficiently and cost-effectively acquired at a position that is: (a) adjacent to a particular horizontal interconnect channel (HIC); or (b) adjacent to a particular vertical interconnect channel (VIC); or (c) where the particular horizontal interconnect channel (HIC) crosses with the particular vertical interconnect channel (VIC). Each of these three realizations advocates for a specific placement of module 710 into a VGB or SVGB that resides immediately adjacent to at least one or both of the particular HIC and the particular VIC.

The FPGA compiler software module 702 may come to further determine that there are function modules such as 720 or more (not shown) that will need to receive the produced, first result signal, $f_p(nT)$. If not forced apart by other considerations, function modules 710 and 720 may be placeable at respective first and second positions that relatively close within the FPGA array. More specifically, the FPGA compiler software module 702 may come to determine that the number of mT input term signals needed for producing the second result signal, $f_Q(f_p(nT),mT)$, may be efficiently and cost-effectively acquired at a second position that is spaced away from the first placement position of function module 710 by a relatively small distance within the FPGA array such that it is possible to use short-haul routing resources like FBL 721 or DCL 741 or 2×L line 722 to couple the first result signal, $f_p(nT)$ through CSE 710a of CBB 710 to CBB 720. Alternatively or additionally, the predefined design definition 701 may be such that the FPGA compiler software module 702 may come to determine that it would be best for timing or other requirements to place hardware-implementing modules 710 and 720 close together.

As seen in FIG. 7A, if modules 710 and 720 are placed close together, any one line among the available interconnect resources of FBL 721, DCL 741, MaxL line 728, 2×L line 722, or other lines 724 and intervening switch boxes 725 may be used for coupling the first result signal, $f_p(nT)$ to second module 720.

If the n number of $f_p(nT)$ is 3 or less and CSE 710a corresponds to FIG. 6, then the FPGA compiler software module 702 should be able to recognize that the least amount of resource consumption would be achieved by using CSE path 672-671 (FIG. 6) and FBL 721 for coupling the first result signal, $f_p(nT)$ to second module 720. No switchboxes would need to be consumed and left-over resources (668, 610, 630, 648) of the CSE 710a would be available for servicing other signals. result signal, $f_p(nT)$ to second module 720.

If the n number of $f_p(nT)$ is greater than 3 and CSE 710a corresponds to FIG. 6, then the FPGA compiler software module 702 should be able to recognize that the next least amount of resource consumption would be achieved by using CSE path 645-668-608 (FIG. 6) and FBL 721 for coupling the first result signal, $f_p(nT)$ to second module 720. No switchboxes would need to be consumed. Longer-haul lines of the interconnect mesh, namely, DCL's, 4×L–8×L lines and MaxL or Half-MaxL lines would remain unconsumed and available for servicing other signals that need such, comparatively longer-haul lines.

If modules 710 and 720 end up being placed further apart than a distance that can be serviced by an FBL such as 721, then the FPGA compiler software module 702 should be able to recognize that the next least amount of resource consumption would be achieved by using a direct connect line such as DCL 741 and that the compiler software module 702 should try to urge the placement of modules 710 and 720 so they can still use a DCL such as 741 for coupling the first result signal, $f_p(nT)$ from the first module 710 to second the module 720.

If modules 710 and 720 end up being placed further apart than a distance that can be serviced by a DCL such as 741, then the FPGA compiler software module 702 should be able to recognize that the next least amount of resource consumption would be achieved by using a 2×L line such as 722. PIP's in terminal switchboxes such as 723 may be wasted by such a routing choice, but at least the comparatively longer-haul, interconnect resources, namely, MaxL line 728 and tristate driver 727 would not be unnecessarily wasted and/or other lines 724 and intervening switch boxes 725 would not be unnecessarily wasted.

It should be apparent in view of the above disclosure that circuit space and resource consumption in an FPGA of the invention may be significantly conserved if the first result signal, $f_p(nT)$ can be efficiently produced by a first CBB and that one or more destination CBB's can be placed immediately adjacent to a FBL that driven by that first CBB. See FIG. 2A. Even with this kind of restrictive constraint, the FPGA compiler software module 702 would have some degrees of freedom in making optimization moves during partitioning, placement and routing because the placements of the destination CBB's are generally interchangeable. Similarly, if the first result signal, $f_p(nT)$ must instead be programmably-routed along a DCL (see 241 of FIG. 2A), the placements of the destination CBB's are still generally interchangeable along that DCL.

Figure 7B:
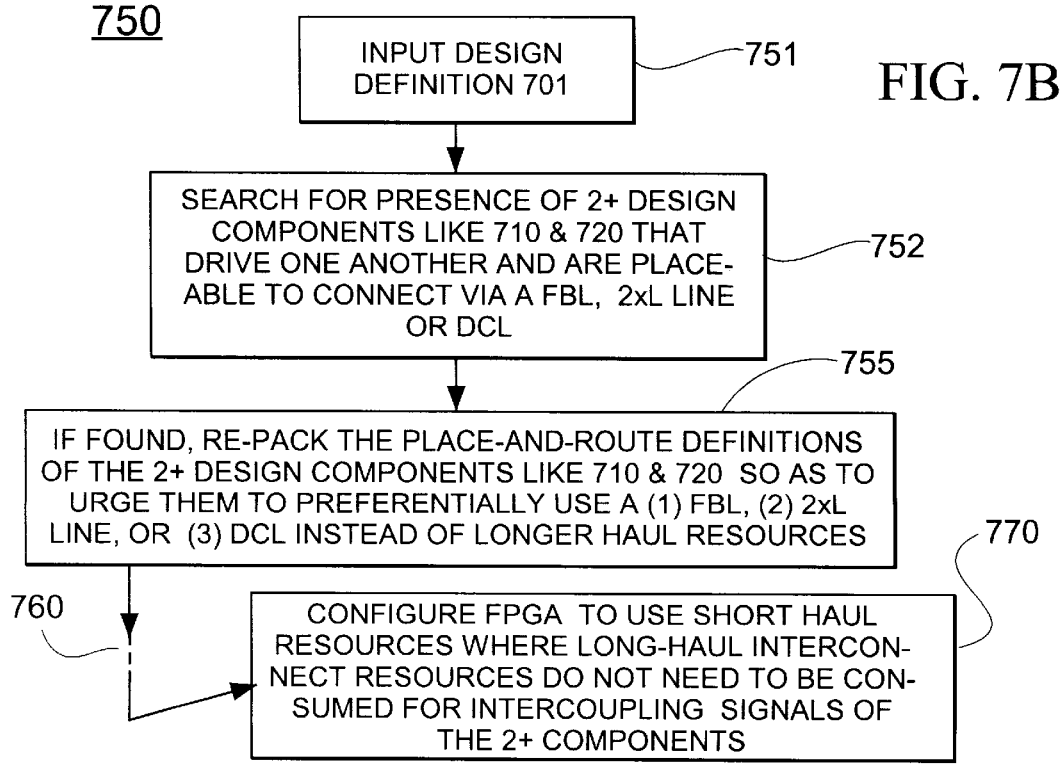
FIG. 7B is a flow chart of a routing process that preferentially uses one of the FBL's or DCL's or 2×L's for providing short-haul routing instead of consuming longer-hauling interconnect resources of the type, 4×L-MaxL.

FIG. 7B illustrates a flow chart of a process 750 that attempts to take advantage of these possibilities. A design definition such as 701 is input at step 751 into the FPGA compiler software module 702. (It is understood that module 702 may be implemented in a general purpose computer.) Numerous processing steps may take place within software module 702. Step 752 is one of those steps in which the software module 702 searches through the input design definition (e.g., 701) for the presence of two or more design components like 710 and 720 that may or are preferably to be spaced close to one another (e.g., so as to be reachable by at least one of an FBL, DCL or 2×L line) and call for the first design component 710 to deliver a result signal, $f_p(nT)$ to at least the nearby second design component 720. Stated otherwise, the use of longer-haul resources such as MaxL line 728, or non-2×L other lines 724 and intervening switch boxes 725 for transferring the first result signal, $f_p(nT)$ from first module 710 to second module 720 becomes less and less justified as the spacing between the possible placements of function modules 710 and 720 decreases. Efficiency-enhancing factors may be defined to weigh against consuming a longline resource such as MaxL line 728 and in favor of instead using a short-haul interconnect resource such as an FBL, DCL or 2×L line for carrying the first result signal, $f_p(nT)$ from source position 710 to destination positions such as 720.

More specifically, if the design specification 701 calls for the first result signal, $f_p(nT)$ to be delivered to destination module 720 in less than a prespecified time limit, and destination module 720 can or must be placed close to source module 710 and/or use of generally-long interconnect resources (e.g., 4×L, 8×L lines) would violate the timing constraint, then use of the fastest and shortest possible one of the FBL, DCL or 2×L lines becomes justified.

At step 755, if two or more design components like 710 and 720 are found to satisfy the search criteria, the place-and-route definitions of those design components are repacked so as to urge those definitions toward ultimately ending up using a short-haul line like 721, 722 and 741 in said order for coupling signal $f_p(nT)$ from source module 710 to destination module 720.

It is understood by those skilled in the art of FPGA configuration that some design factors (such as sharing of the $f_p(nT)$ signal) may pull the two design components like 710 and 720 toward closer placement relative to one another in the FPGA and that other design considerations may push them far apart (such as the non-shared nT and mT input term signals). Similarly, some design factors (such as time constraints on the $f_p(nT)$ signal) may weigh in favor of using a longline for routing a particular signal while other factors may weigh against such a routing decision The FBL/2×L/DCL-favoring factor produced in step 755 is just one of such plural weighting factors. Other weighting factors may cause the ultimate configuration to not use the place and route configuration suggested by the illustration in box 701 of FIG. 7A.

Dashed path 760 of FIG. 7B represents many other processes within the software module 702 wherein the original design definition 701 is transformed by steps such as design-partitioning, partition-placements and inter-placement routings to create a configuration file for the target FPGA (e.g., 200). Step 770 assumes that at least two design components like 710 and 720 were found and were ultimately partitioned and placed close together while a decision was made to use one of a FBL 721, 2×L line 722 or DCL 741 for intercoupling the $f_p(nT)$ signal. In that case, at step 770 the target FPGA 200 (400) is configured to use the selected one of FBL 721, 2×L line 722 and DCL 741 for coupling a signal such as $f_p(nT)$ from a first-placed module such as 710 to one- or more closely placed modules such as 720.

The basic message of FIG. 5A as presented here is to identify the AIL numbers of different kinds of interconnect lines and to show how such AIL's (adjacent interconnect lines) can supply data and/or controls to each CBB. The same AIL numbers are used in next-described FIGS. 8A–8D.

Figure 8A:
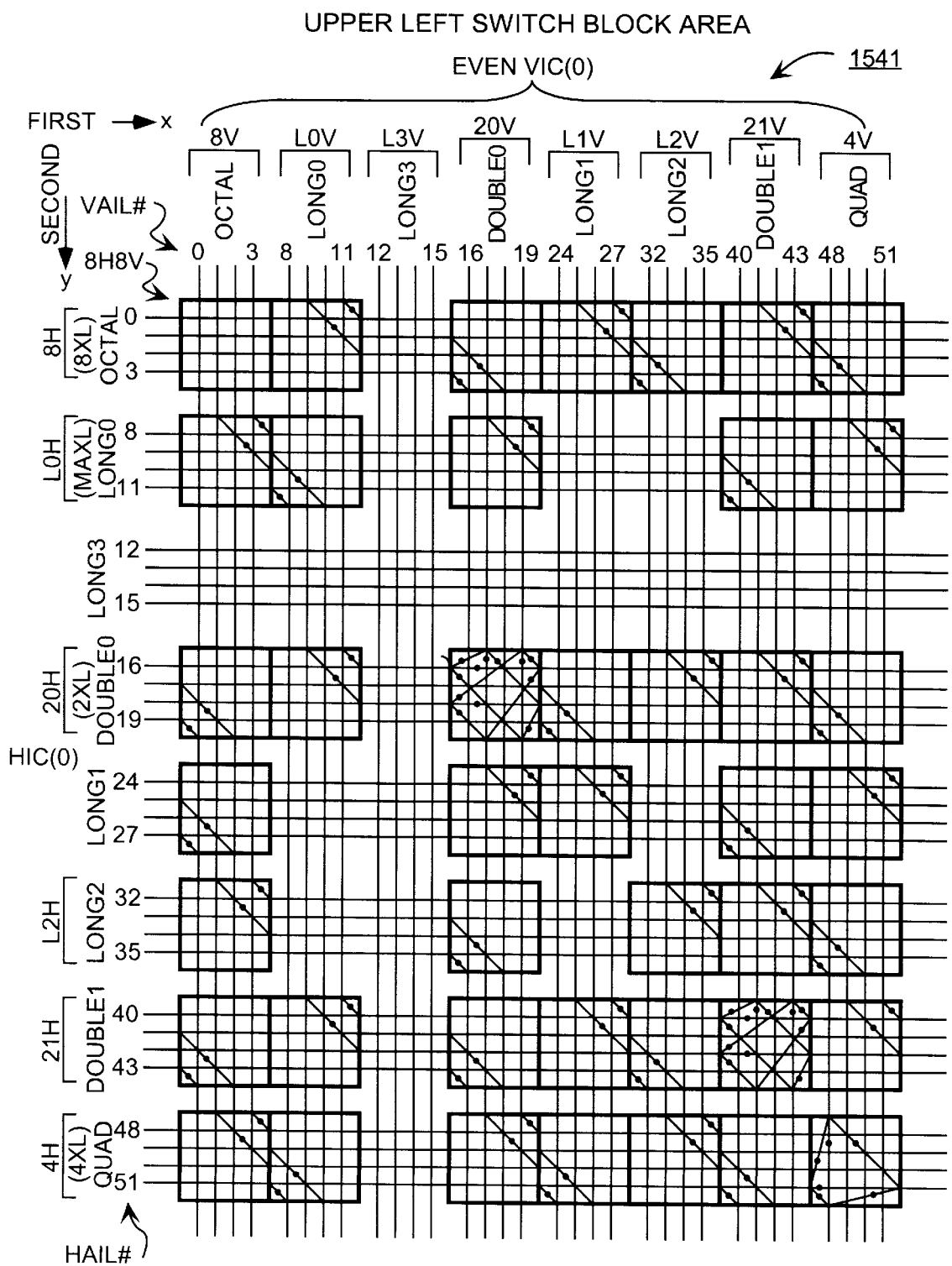
FIGS. 8A–8D respectively diagram NW, NE, SE, and SW switchbox areas of one embodiment of FIG. 4.

FIG. 8A is a schematic of one embodiment 1541 of SBA 441 (NorthWest) of FIG. 4. This SBA 1541 forms at each intersection of an even-numbered vertical interconnect channel (e.g., VIC(0)) with an even-numbered horizontal interconnect channel (e.g., HIC(0)). Strapping PIP's are represented by darkened circles. AIL's that have no PIP on them are understood to pass continuously through the switchbox area without terminating at a PIP. The sub-area where the horizontal octal-length nibble bus crosses with the vertical octal-length nibble bus is referenced as 8H8V. Note that there are no PIP's in sub-area 8H8V. This is so because in FIG. 3 there are no octal switchboxes in even-numbered interconnect channels.

PIP's found on diagonal lines such as PIP's 0 and 1 of sub-area 8HL0V provide a path for transferring signals from one kind of line to another. PIP 0 for example may be activated to propagate a signal on VIC longline 9 to HIC octal line 2. Similarly PIP 1 may be activated during configuration time to propagate a signal on VIC longline 11 to HIC octal line 0. In one embodiment, it is preferable to propagate such cross-kind signals only in the direction from a sourcing longline (MaxL line) to another line. This is so for two reasons. First, the 2/4/8×L line drivers in VGB's are not tri-stateable, only longline drive amplifiers are tri-stateable. And it is desirable to have only tri-stateable drivers coupled for driving the longlines so that such longlines may be shared on a time-multiplexed basis by the various resources of the FPGA, namely, SVGB's, embedded SRAM blocks, and IOB's. (The IOB's allow the in-FPGA longlines to become extensions of tri-stated, external buses.) A second reason for not permitting driving of signals from 2×L, 4×L or 8×L lines to MaxL lines is that the 2/4/8×L line drivers in the VGB's are not powerful enough in that embodiment to drive the capacitive load of the MaxL lines.

On the other hand, the shared MaxL line drivers of each SVGB are powerful enough to cope with the additional load of one or a few more 2×L, 4×L or 8×L lines being added to a given longline. The longline (MaxL line) can then act as a signal-b roadcasting highway and the orthogonally added 2×L, 4×L or 8×L lines can act as local exit ramps for distributing the broadcast signal to adjacent neighborhoods.

In one embodiment, there are weakly-pulled up longlines around the periphery of the chip that are driven by the IOB's. These special longlines are referred to as NOR lines because they can be used to implement wired NOR functions. Both the NOR lines and the regular longlines are tri-stateable. The 2×L, 4×L and 8×L lines are on the other hand generally not tri-stateable by virtue of the 2/4/8×L drivers that are couplable to them. However, the 2×L, 4×L and 8×L lines can be made tri-stateable extensions of longlines as seen by sub-areas such as 8HL0V, L0H8V, 20HL0V, and 4HL0V.

Orthogonal interconnection s may be made between 2×L, 4×L and 8×L lines that are not being driven by tristate drivers. Examples of such orthogonal interconnection options are seen in sub-areas such as 8H20V, 8H4V, 4H21V, and 4H4V.

Note that the vertical and horizontal, max-length nibble buses identified as Long3 (L3V and L3H) have no PIP's breaking them up or branching from them in the SBA. Each branching off PIP such a s those in sub-area 8HL0V add capacitive loading to the respectively attached lines (e.g., VAIL #9 and HAIL #2 in the case of sub-area 8HL0V). Max-length nibble buses L3V and L3H are spared from having such added loading.

Each 2 PIP sub-area such as 8HL0V may be considered as a 2-PIP switchbox. There are other kinds as well.

An example of a 12 PIP switchbox is seen in sub-area 20H20V (the crossing of the Double0 nibble buses). Another such 12 PIP switchbox is seen in sub-area 21H21V. Note that every other 2×L line terminates at a PIP. HAIL #16 (horizontal adjacent interconnect line number 16) terminates in sub-area 20H20V while HAIL #17 passes through. VAIL #17 terminates in sub-area 20H20V while VAIL #16 passes through.

An example of a 6 PIP switchbox is seen in sub-area 4H4V. Note that one of every four 4×L lines terminates at a PIP. HAIL #51 terminates in sub-area 4H4 while HAIL's #48, #49, #50 pass through. VAIL #48 terminates in sub-area 4H4 while HAIL's #49, #50 and #51 pass through.

Figure 8B:
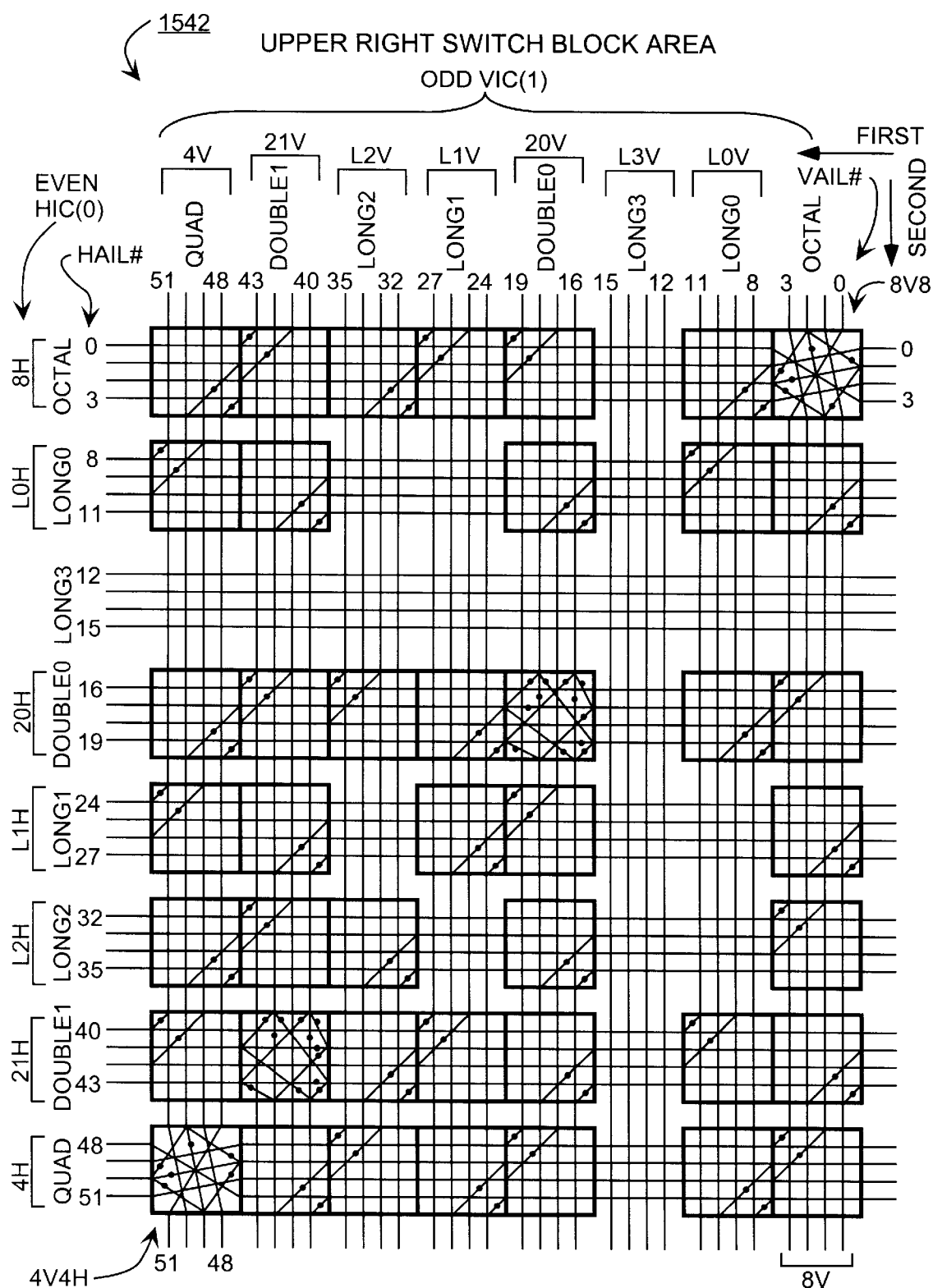

FIG. 8B is a schematic of one embodiment 1542 of SBA 442 (NorthEast) of FIG. 4. This SBA 1542 forms at each intersection of an odd-numbered vertical interconnect channel (e.g., VIC(1)) with an even-numbered horizontal interconnect channel (e.g., HIC(0)). As in FIG. 8B, strapping PIP's are represented by darkened circles. AIL's that have no PIP on them are understood to pass continuously through the switchbox area without terminating at a PIP.

Note that unlike FIG. 8A (SBA 1541), there are PIP's in sub-area 8V8H. This is so because in FIG. 3 there are octal switchboxes in odd-numbered interconnect channels.

Note further that VAIL numbers run right to left in FIG. 8B instead of left to right as in FIG. 8A.

There is one more oddity in FIG. 8B, sub-areas 8V8H and 4V4H 'braid' the respective HAIL's and VAIL's running through them. The quad-length nibble buses and octal-length nibble buses may be viewed as 3-dimensional tubular structures that undergo a one step 'twist' or braiding action as they pass through odd-numbered channels. More specifically, note in FIG. 8B that a signal entering from the left on HAIL #1 is braided in sub-area 8V8H to emerge on the right on HAIL #0. Similarly, a signal entering from the left on HAIL #2 is braided in sub-area 8V8H to emerge on the right on HAIL #1 if it passes through the intervening PIP in sub-area 8V8H. A signal entering from the left on HAIL #3 is braided in sub-area 8V8H to emerge on the right on HAIL #2. A signal entering from the left on HAIL #0 is braided in sub-area 8V8H to emerge on the right on HAIL #3.

A similar process occurs in the vertical direction. A signal entering from the top on VAIL #1 is braided in sub-area 8V8H to emerge on the bottom on VAIL #0. A signal entering from the top on VAIL #2 is braided in sub-area 8V8H to emerge on the bottom on VAIL #1 if it passes through the intervening PIP in sub-area 8V8H. A signal entering from the top on VAIL #3 is braided in sub-area 8V8H to emerge on the bottom on VAIL #2. A signal entering from the top on VAIL #0 is braided in sub-area 8V8H to emerge on the bottom on VAIL #3. As mentioned above, similar horizontal and vertical braiding operations occur in sub-area 4V4H.

Braiding provides a number of benefits. It rotates signals circumferentially through the hypothetical, 3D tubular structures of the quad-length nibble buses and the octal-length nibble buses so that a same signal may be accessed from differently numbered AIL's by corresponding CBB's (see FIG. 5A). It allows a same output connection pattern to be used by the 2/4/8×L drivers of each CBB because a signal output by a like 2/4/8×L driver in a nearby CBB will have rotated due to braiding so as to avoid contention. It provides a same repeatable pattern for chip layout. It provides a same repeatable pattern for analysis by FPGA synthesis software. The latter helps to speed the processing time of the FPGA synthesis software so that users can have more time for physical testing after each iterative reconfiguration of the target FPGA.

Note that there is no braiding in the double-length nibble buses. The 2×L lines terminate each at both ends in either odd-numbered channels or in even-numbered channels.

Figure 8C:
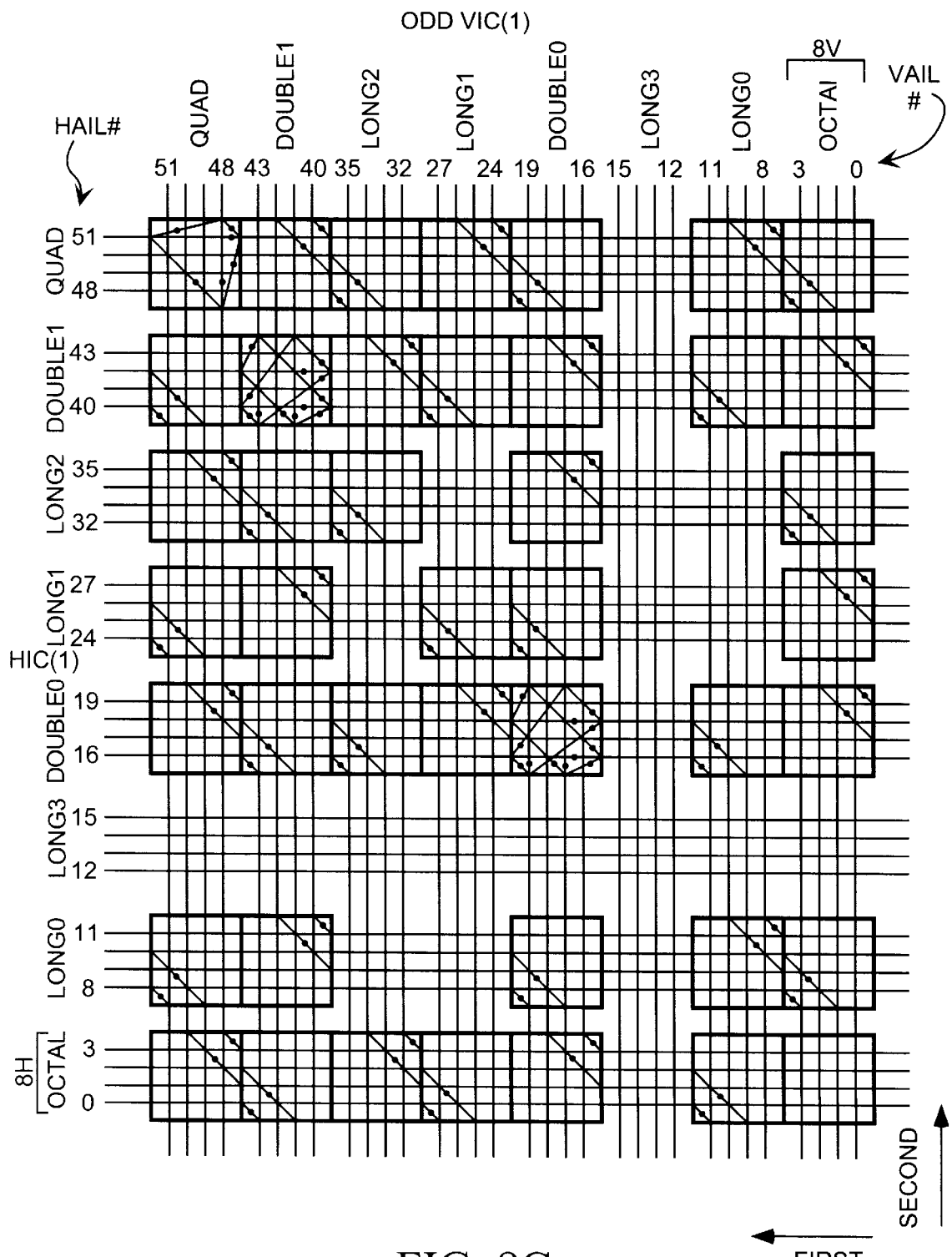

FIG. 8C is a schematic of one embodiment 1544 of SBA 444 (SouthEast) of FIG. 4. This SBA 1544 forms at each intersection of an odd-numbered vertical interconnect channel (e.g., VIC(1)) with an odd-numbered horizontal interconnect channel (e.g., HIC(1)). SBA 1544 is essentially a mirror image about the tile diagonal with SBA 541. Note that VAIL numbers run right to left in FIG. 8C instead of left to right as in FIG. 8A. Note further that HAIL numbers run bottom to top in FIG. 8C instead of top to bottom as in FIG. 8A.

Figure 8D:
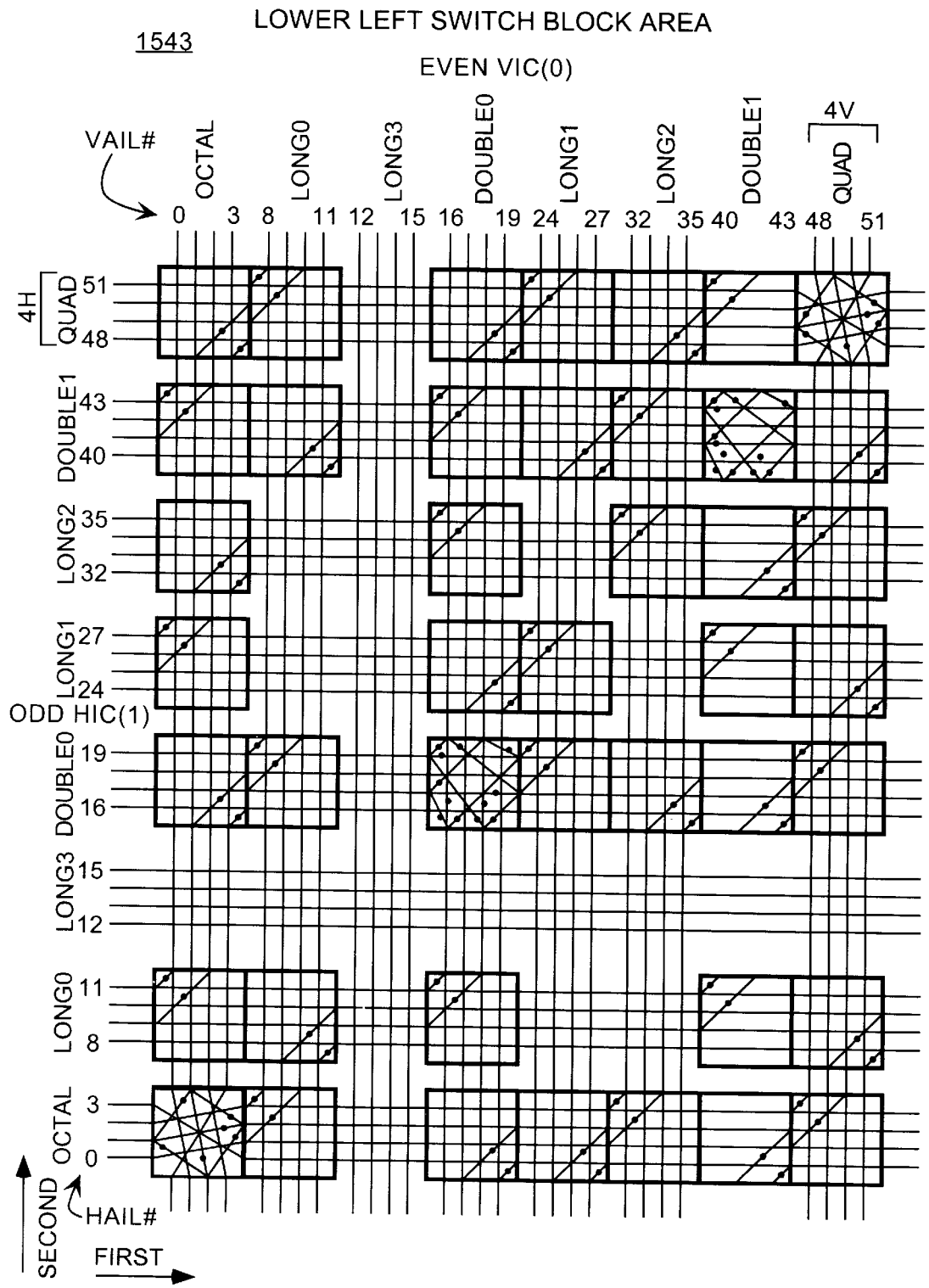

FIG. 8D is a schematic of one embodiment 1543 of SBA 443 (SouthWest) of FIG. 4. This SBA 1543 forms at each intersection of an even-numbered vertical interconnect channel (e.g., VIC(0)) with an odd-numbered horizontal interconnect channel (e.g., HIC(1)). SBA 1543 is essentially a mirror image about the tile diagonal with SBA 1542. Note that VAIL numbers run left to right as in FIG. 8A. Note further that HAIL numbers run bottom to top as in FIG. 8C. Braiding is seen at sub-areas 4V4H and 8V8H.

Various modifications and variations in accordance with the spirit of the above disclosure will become apparent to those skilled in the art after having read the foregoing. For example, the longline drivers of the embodiment need not be tristate line drivers but instead may be other kinds of line driver such as an open collector line drivers. The above disclosure is therefore to be taken as illustrative of the invention, not as limiting its scope or spirit.

Given the above disclosure of general concepts and specific embodiments, the scope of protection sought is to be defined by the claims appended hereto.

What is claimed is:

1. A user-configurable integrated circuit device comprising:
    (a) an array of plural interconnect resources including plural interconnect lines and plural switchbox areas each for programmably routing signals from terminal ends of interconnect lines that terminate in the switchbox area to get other interconnect lines that pass through or also terminate in the switchbox area; and
    (b) an array of plural Variable Grain Blocks (VGB's) interspersed within the array of plural interconnect resources, wherein each VGB includes:
        (b.1) a plurality of Configurable Building Blocks (CBB's) each having at least one user-programmable lookup table, said CBB's being programmably foldable-together to thereby define function synthesizing units of greater complexity than that of a single CBB; and
        (b.2) signal acquisition means for programmably and selectively acquiring input term signals from adjacent interconnect lines and for supplying the acquired signals to respective ones of the CBB's within the VGB; and
        (b.3) signal output means for outputting CBB result signals to adjacent interconnect lines;
        (a.1) wherein said array of plural interconnect resources does not regularly include interconnect lines of single-length or shorter, said single-length corresponding to a traverse of a continuous distance covering approximately one VGB.
2. An integrated circuit device according to claim 1 wherein said array of plural interconnect resources regularly includes successive switchbox areas that are spaced apart from one another by no less than double-length distances.
3. An integrated circuit device according to claim 1 wherein said array of plural interconnect resources regularly includes both double-length lines and quad-length lines.
4. An integrated circuit device according to claim 1 wherein said array of plural interconnect resources regularly includes both double-length lines and octal-length lines.
5. An integrated circuit device according to claim 1 wherein said array of plural interconnect resources regularly includes both double-length lines and hexadecimal-length lines.

6. An integrated circuit device according to claim 1 wherein said array of plural interconnect resources regularly includes both double-length lines and feedback lines, said feedback lines each extending at least a double-length distance past two channel-facing sides of a respective VGB.

7. An integrated circuit device according to claim 1 wherein said array of plural interconnect resources regularly includes both double-length lines and direct connect lines, said direct connect lines each extending from a signal-sourcing VGB to at least eight other, signal-receiving VGB's.

8. An integrated circuit device according to claim 1 wherein groups of said VGB's are wedged together so as to have no intervening channels of general interconnect lines provided between the wedged together VGB's.

9. The integrated circuit device of claim 1 wherein said array of plural interconnect resources regularly includes:
 (a.2) first general interconnect lines having continuous lengths for distances of at least two VGB's; and
 (a.3) second general interconnect lines having continuous lengths for distances of at least twice those of the first general interconnect lines;
 (a.2) wherein said first and second general interconnect lines terminate in respective switchbox areas and the respective switchbox areas include signal-continuing means each for programmably routing signals from terminal ends of interconnect lines that terminate in the switchbox area to yet other interconnect lines that also terminate in the switchbox area.

10. A tileable circuit comprising:
 (a) a plurality of Variable Grain Blocks (VGB's) disposed in mirror symmetry to one another;
 (b) a plurality of interconnect channel sections each having an equivalent plurality of interconnect lines of differing continuous lengths and/or directional orientations, where said interconnect channel sections are disposed in mirror symmetry to one another so as to surround said plurality of VGB's, where pairs of the channel sections extend to intersect; and
 (c) a plurality of interconnect switch sections each disposed at an intersection of channel sections, where each of the interconnect switch sections has an equivalent plurality of switching circuits for routing signals between the interconnect lines of the there-intersecting channel sections, and where the plurality of interconnect switch sections are disposed in mirror symmetry to one another so as to surround said plurality of VGB's; and
  (c.1) wherein said interconnect switch sections are spaced apart from one another by a distance corresponding to at least two VGB's.

11. A method for transferring signals between neighboring Configurable Building Blocks (CBB's) of a Variable Grain Architecture device having Variable Grain Blocks (VGB's) and having no regular pattern lines of single-length or shorter, the single-length corresponding to a traverse of a continuous distance covering approximately one VGB, said method comprising the step of transferring said signals through one or more of:
 (a) double-length lines running adjacent to the CBB's;
 (b) feedback lines each extending at least a double-length distance along a channel-facing side of a respective VGB; and
 (c) direct connect lines lines each extending from a signal-sourcing VGB to at least eight other, signal-receiving VGB's.

12. A method for configuring a Variable Grain Architecture device having Variable Grain Blocks (VGB's) and having no regular pattern lines of single-length or shorter, the single-length corresponding to a traverse of a continuous distance covering approximately one VGB, said method comprising the steps of urging placement of intercoupled modules close to one another and of transferring an intercoupled signal through a selected one of:
 (a) double-length lines running adjacent to the CBB's;
 (b) feedback lines each extending at least a double-length distance along a channel-facing side of a respective VGB; and
 (c) direct connect lines lines each extending from a signal-sourcing VGB to at least eight other, signal-receiving VGB's.

13. A machine-implemented method of creating configuration data for configuring a field programmable gate array (FPGA) device,
 where the FPGA device has a Variable Grain Architecture composed of an array of Variable Grain Blocks (VGB's) and each VGB includes plural Configurable Building Blocks (CBB's) that can be programmably cascaded or programmably folded-together to define cascadable function synthesizing units more complex than a basic function synthesizing unit represented by one CBB;
 where the FPGA device has a VGB-interconnecting mesh which does not have a regular pattern of interconnect lines of single-length or shorter, the single-length corresponding to a traverse of a continuous distance covering approximately one VGB;
 where the VGB-interconnecting mesh includes short-haul general interconnect lines of continuous double or greater length, intermediate-haul general interconnect lines of continuous quad or greater length, and longlines of continuous maximum length across said array of VGB's, the length of the intermediate-haul general interconnect lines being less than that of the longlines but greater than that of the short-haul general interconnect lines; and
 where the VGB-interconnecting mesh includes switch-boxes for programmably continuing signal flow from one general interconnect line to a next for general interconnect lines that terminate in such switchboxes;
 said creating method comprising:
  (a) searching for placeable and to-be-intercoupled modules; and
  (b) urging placement of said placeable and to-be-intercoupled modules into function synthesizing units that are sufficiently close to one another so as to enable flow between the function synthesizing units of corresponding module-intercoupling signals through correspondingly adjacent ones of said short-haul general interconnect lines, the enabled flow not requiring flow through said switchboxes.

14. The creating method of claim 13 wherein:
 the VGB-interconnecting mesh includes dedicated direct-connect lines of continuous double or greater length, each such direct-connect line being dedicated for carrying a signal sourced by a specific CBB; and said creating method further comprises:
  (c) urging placement of said placeable and to-be-intercoupled modules into function synthesizing units that are sufficiently close to one another so as to enable flow between the function synthesizing units of corresponding module-intercoupling signals through correspondingly adjacent ones of said direct-connect lines, the enabled flow not requiring flow through said switchboxes.

15. The creating method of claim 13 wherein:
each given VGB includes internal feedback lines for interconnecting internal CBB's of the given VGB, each such feedback line having a continuous length of more than two CBB's; and said creating method further comprises:
(c) urging placement of said placeable and to-be-intercoupled modules into function synthesizing units that are sufficiently close to one another so as to enable flow between the function synthesizing units of corresponding module-intercoupling signals through correspondingly adjacent ones of said feedback lines, the enabled flow not requiring flow through said switchboxes.

16. A machine-implemented method of creating configuration data for configuring a field programmable gate array (FPGA) device to implement plural design modules of a supplied design definition,
where the FPGA device has a Variable Grain Architecture composed of an array of Variable Grain Blocks (VGB's) and each VGB includes plural Configurable Building Blocks (CBB's) that can be programmably cascaded or programmably folded-together to define cascadable function synthesizing units more complex than a basic function synthesizing unit represented by one CBB;
where the FPGA device has a VGB-interconnecting mesh composed of horizontal and vertical interconnect channels and where the VGB-interconnecting mesh does not have a regular pattern of interconnect lines of single-length or shorter, the single-length corresponding to a traverse of a continuous distance covering approximately one VGB;
where the VGB-interconnecting mesh includes short-haul general interconnect lines of continuous double or greater length and longlines of continuous maximum length across said array of VGB's, the length of the short-haul general interconnect lines being less than that of the longlines; and
where the VGB-interconnecting mesh includes switchboxes for programmably continuing signal flow from one general interconnect line to a next for general interconnect lines that terminate in such switchboxes;
said creating method comprising:
(a) determining that factors exist for favoring placement of a first design module in a first function synthesizing unit of a corresponding first VGB that is immediately adjacent to one or both of particular horizontal and vertical interconnect channels, where the first design module produces a respectively synthesized, first function signal;
(b) searching the supplied design definition for a variably-placeable second design module that needs to receive the first function signal or its equivalent for respectively producing therefrom, a second function signal; and
(c) urging placement of said variably-placeable second design module in a corresponding second function synthesizing unit that is sufficiently close to the first function synthesizing unit so as to enable flow from the first function synthesizing unit to the second function synthesizing unit of the first function signal by way of a short-haul general interconnect line that is adjacent to both of the first and second function synthesizing units, where the enabled flow does not require flow through said switchboxes.

17. The creating method of claim 16 wherein:
the VGB-interconnecting mesh includes dedicated direct-connect lines of continuous double or greater length, each such direct-connect line being dedicated for carrying a signal sourced by a specific CBB; and said creating method further comprises:
(d) additionally urging placement of said placeable and to-be-intercoupled second design module into a function synthesizing unit that is sufficiently to the first function synthesizing unit so as to enable flow from the first function synthesizing unit to the second function synthesizing unit of the first function signal by way of a direct connect line that is driveable by the first function synthesizing unit and is adjacent to the second function synthesizing units, where the enabled, direct-connect flow does not require flow through said switchboxes.

18. The creating method of claim 16 wherein:
each given VGB includes internal feedback lines for interconnecting internal CBB's of the given VGB, each such feedback line having a continuous length of more than two CBB's; and said creating method further comprises:
(d) additionally urging placement of said placeable and to-be-intercoupled second design module into a function synthesizing unit that is sufficiently to the first function synthesizing unit so as to enable flow from the first function synthesizing unit to the second function synthesizing unit of the first function signal by way of an adjacent ones of said feedback lines, the enabled feedback flow not requiring flow through said switchboxes.

19. A user-configurable integrated circuit device comprising:
(a) an array of Variable Grain Blocks (VGB's) where each VGB includes plural Configurable Building Blocks (CBB's) that can be programmably cascaded and programmably folded-together to define cascadable function synthesizing units more complex than a basic function synthesizing unit defined by one CBB;
(b) a VGB-interconnecting mesh composed of horizontal and vertical interconnect channels and where the VGB-interconnecting mesh does not have a regular pattern of general interconnect lines of continuous single-length or shorter, the single-length corresponding to a traverse of a continuous distance covering approximately one VGB;
(b.1) where the VGB-interconnecting mesh includes short-haul general interconnect lines of continuous double or greater length and longlines of continuous maximum length across said array of VGB's, the length of the short-haul general interconnect lines being less than that of the longlines; and
(b.2) where the VGB-interconnecting mesh includes switchboxes for programmably continuing signal flow from one general interconnect line to a next for general interconnect lines that terminate in such switchboxes;
and further wherein signal flow can be programmably routed between function synthesizing units defined by different CBB's or different VGB's by way of said short-haul general interconnect lines without routing through said switchboxes.

20. The user-configurable integrated circuit device of claim 19 wherein:

(b.3) the VGB-interconnecting mesh includes intermediate-haul general interconnect lines of continuous quadruple or greater length, said intermediate-haul general interconnect lines being longer than the short-haul general interconnect lines but shorter than the longlines, and further wherein signal flow can be programmably routed between function synthesizing units of different CBB's or different VGB's by way of said intermediate-haul general interconnect lines without routing through said switchboxes.

21. The user-configurable integrated circuit device of claim 19 wherein:

(b.3) the VGB-interconnecting mesh includes dedicated direct-connect lines of continuous double or greater length, each such direct-connect line being dedicated for carrying a signal sourced by a specific CBB for selectively direct receipt by one or more of at least 8 other CBB's, and further wherein signal flow can be programmably routed between function synthesizing units of different CBB's or different VGB's by way of said direct-connect lines without routing through said switchboxes.

22. The user-configurable integrated circuit device of claim 21 wherein:

(b.3a) each direct-connect line is dedicated for carrying a signal sourced by a specific CBB for selectively direct receipt by one or more of at least 16 other CBB's and at least plural ones of said other CBB's reside in VGB's other than the VGB of the specific CBB.

23. The user-configurable integrated circuit device of claim 19 wherein:

(a.1) the CBB's within each said VGB are wedged together so as to have no intervening channels of general interconnect lines provided between the wedged together CBB's.

24. The user-configurable integrated circuit device of claim 19 wherein:

(b.3) the VGB-interconnecting mesh includes mini-broadcast interconnect lines of continuous half maximum or shorter length, said mini-broadcast interconnect lines being coupled to tristateable outputs of respective tristate line drivers and said mini-broadcast interconnect lines being longer than the short-haul general interconnect lines but shorter than the maximum length of the longlines.

25. The user-configurable integrated circuit device of claim 19 wherein:

(b.3) the VGB-interconnecting mesh includes intermediate-haul general interconnect lines of continuous quadruple or greater length, said intermediate-haul general interconnect lines being longer than the short-haul general interconnect lines but shorter than the longlines, (b.4) the VGB-interconnecting mesh includes dedicated direct-connect lines of continuous double or greater length, each such direct-connect line being dedicated for carrying a signal sourced by a specific CBB for selectively direct receipt by one or more of at least 16 other CBB's, and further wherein signal flow can be programmably routed between function synthesizing units of different CBB's or different VGB's by way of one or both of said intermediate-haul general interconnect lines and said direct-connect lines without routing through said switchboxes.

26. A user-configurable integrated circuit device comprising:

(a) an array of Configurable Building Blocks (CBB's) that can each be programmably configured to define one or more basic function spawning and/or synthesizing units, where said CBB's can be programmably cascaded one to the next and alternatively programmably folded-together to thereby define nonbasic function synthesizing units which are more complex than one basic function synthesizing unit defined by a respective one CBB;

(b) a CBB-interconnecting mesh composed of horizontal and vertical interconnect channels and where the CBB-interconnecting mesh does not have a regular pattern of general interconnect lines of continuous single-length or shorter, the single-length corresponding to a traverse of a continuous distance covering approximately two CBB's;

(b.1) where the CBB-interconnecting mesh includes short-haul general interconnect lines each of a continuous and respective double or greater length, said double length corresponding to a traverse of a continuous distance covering approximately four CBB's; and (b.2) where the CBB-interconnecting mesh includes switchboxes for programmably continuing signal flow from one general interconnect line to a next at least for general interconnect lines that terminate in such switchboxes;

and further wherein signal flow can be programmably routed between function synthesizing units defined by different CBB's or folding-togethers of such CBB's by way of said short-haul general interconnect lines without routing through said switchboxes.

27. The user-configurable integrated circuit device of claim 26 wherein:

(b.3) the CBB-interconnecting mesh includes dedicated direct-connect lines of continuous double or greater length, each such direct-connect line being dedicated for carrying a signal sourced by a specific CBB for selectively direct receipt by one or more of at least 16 other CBB's, and further wherein signal flow can be programmably routed between function synthesizing units defined by different CBB's or folding-togethers of such CBB's by way of said direct-connect lines without routing through said switchboxes.

28. The user-configurable integrated circuit device of claim 27 wherein each direct-connect line has a cross-hair distribution structure.

29. The user-configurable integrated circuit device of claim 27 wherein:

(b.4) the CBB-interconnecting mesh includes dedicated feedback lines of continuous double or shorter, each such feedback line being dedicated for carrying a signal sourced by a specific CBB for selectively direct receipt by one or more of at least 3 other CBB's, and further wherein signal flow can be programmably routed between function synthesizing units defined by different CBB's or folding-togethers of such CBB's by way of said feedback lines without routing through said switchboxes.

30. The user-configurable integrated circuit device of claim 29 wherein:

(b.5) the CBB-interconnecting mesh includes broadcast interconnect lines of continuous maximum array or shorter length, said maximum array length corresponding to a maximum length across said array of CBB's, said broadcast interconnect lines being coupled to tristateable outputs of respective tristate line drivers and said broadcast interconnect lines being longer than the short-haul general interconnect lines.

31. The user-configurable integrated circuit device of claim 30 wherein signal-forwarding points are provided in said switchboxes for selectively forwarding a signal traveling on one of said broadcast interconnect lines to a corresponding one or more crossing ones of said short-haul general interconnect lines.

* * * * *

UNITED STATES PATENT AND TRADEMARK OFFICE
CERTIFICATE OF CORRECTION

PATENT NO. : 6,163,168  
DATED : December 19, 2000  
INVENTOR(S) : Bai Nguyen et al.

Page 1 of 1

It is certified that error appears in the above-identified patent and that said Letters Patent is hereby corrected as shown below:

Column 5,  
Lines 62 and 65, "continues" should be -- continuous --.

Column 7,  
Line 35, "turns" should be -- turn --.

Column 12,  
Line 23, "length s" should be -- lengths --.

Column 17,  
Line 9, "FIG. SA" should be -- FIG. 5A --.

Column 23  
Lines 63-64, delete "result signal, $f_p(nT)$ to second module 720".

Column 28,  
Line 31, "get" should be -- yet --.

Column 29,  
Line 23, "(a.2)" should be -- (a.4) --.

Column 30,  
Line 13, delete "lines" (second occurrence).

Signed and Sealed this

Nineteenth Day of March, 2002

Attest:

JAMES E. ROGAN  
Director of the United States Patent and Trademark Office

Attesting Officer